United States Patent
Kitai et al.

(10) Patent No.: US 9,708,468 B2
(45) Date of Patent: Jul. 18, 2017

(54) THERMOSETTING RESIN COMPOSITION, PREPREG, METAL CLAD LAMINATE PLATE, AND PRINTED WIRING BOARD

(71) Applicant: Panasonic Intellectual Property Management Co., Ltd., Osaka (JP)

(72) Inventors: Yuki Kitai, Osaka (JP); Hiroaki Fujiwara, Fukushima (JP); Hirosuke Saito, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/775,691

(22) PCT Filed: Oct. 23, 2014

(86) PCT No.: PCT/JP2014/005379
§ 371 (c)(1),
(2) Date: Sep. 12, 2015

(87) PCT Pub. No.: WO2015/064064
PCT Pub. Date: May 7, 2015

(65) Prior Publication Data
US 2016/0060429 A1    Mar. 3, 2016

(30) Foreign Application Priority Data

Oct. 31, 2013 (JP) ................... 2013-227673
Oct. 31, 2013 (JP) ................... 2013-227674
Oct. 31, 2013 (JP) ................... 2013-227675

(51) Int. Cl.

| | |
|---|---|
| C08K 5/521 | (2006.01) |
| C08J 5/24 | (2006.01) |
| C08K 3/34 | (2006.01) |
| C08L 63/00 | (2006.01) |
| C08L 101/00 | (2006.01) |
| C08K 5/49 | (2006.01) |
| H05K 1/03 | (2006.01) |
| B32B 15/14 | (2006.01) |
| C08K 3/36 | (2006.01) |
| C08K 5/5399 | (2006.01) |
| C08G 59/40 | (2006.01) |

(52) U.S. Cl.
CPC ............. *C08K 5/521* (2013.01); *B32B 15/14* (2013.01); *C08G 59/4014* (2013.01); *C08J 5/24* (2013.01); *C08K 3/34* (2013.01); *C08K 3/36* (2013.01); *C08K 5/49* (2013.01); *C08K 5/5399* (2013.01); *C08L 63/00* (2013.01); *C08L 101/00* (2013.01); *H05K 1/036* (2013.01); *H05K 1/0373* (2013.01); *B32B 2260/021* (2013.01); *B32B 2260/046* (2013.01); *B32B 2307/306* (2013.01); *B32B 2307/3065* (2013.01); *B32B 2457/08* (2013.01); *C08J 2300/24* (2013.01); *C08J 2371/12* (2013.01); *C08K 2201/014* (2013.01); *H05K 2201/012* (2013.01); *H05K 2201/0209* (2013.01)

(58) Field of Classification Search
CPC ................................. C08K 5/49; C08K 5/521
See application file for complete search history.

(56) References Cited

U.S. PATENT DOCUMENTS

| | | | |
|---|---|---|---|
| 2006/0099391 A1 | 5/2006 | Tomioka et al. | |
| 2009/0203279 A1* | 8/2009 | Mori | ............ C08G 65/44 442/233 |
| 2010/0025084 A1 | 2/2010 | Ezaki et al. | |
| 2015/0376444 A1* | 12/2015 | Saito | ............ C08L 71/12 174/258 |

FOREIGN PATENT DOCUMENTS

| | | |
|---|---|---|
| JP | 2000-290490 | 10/2000 |
| JP | 2000-344917 | 12/2000 |
| JP | 2001-261786 | 9/2001 |
| JP | 2003-128909 | 5/2003 |
| JP | 2004-315725 | 11/2004 |
| JP | 2006-131743 | 5/2006 |
| JP | 2006-193584 | 7/2006 |
| JP | 2009-073996 | 4/2009 |
| JP | 2010-053178 | 3/2010 |
| JP | 2010-059363 | 3/2010 |
| JP | 2010-235690 | 10/2010 |
| JP | 2011-052165 | 3/2011 |
| JP | 2011-233883 | 11/2011 |
| WO | 2008/066101 | 6/2008 |

OTHER PUBLICATIONS

International Search Report of PCT application No. PCT/JP2014/005379 dated Nov. 18, 2014.

* cited by examiner

*Primary Examiner* — Megan McCulley
(74) *Attorney, Agent, or Firm* — Greenblum & Bernstein, P.L.C.

(57) ABSTRACT

A thermosetting resin composition contains a thermosetting resin, a hardener capable of reacting with the thermosetting resin, and a flame retardant. The flame retardant contains a first phosphor compound compatible with a mixture of the thermosetting resin and the hardener, and a second phosphor compound incompatible with the mixture.

26 Claims, 1 Drawing Sheet

THERMOSETTING RESIN COMPOSITION, PREPREG, METAL CLAD LAMINATE PLATE, AND PRINTED WIRING BOARD

TECHNICAL FIELD

The present invention relates to a thermosetting resin composition, a prepreg containing the composition, a metal-clad laminate formed by using the prepreg, and a printed circuit board formed by using the laminate.

BACKGROUND ART

Thermosetting resin compositions are generally superior to thermoplastic resins in heat resistance and also in other characteristics, such as electrical insulation and dimensional stability. For this reason, thermosetting resin compositions are widely used as a material for the substrate, which forms the insulating layer of a printed circuit board.

When used as a substrate material, thermosetting resin compositions are required to be excellent not only in heat resistance but also in flame retardance after hardened. These compositions, however, are mainly composed of a resin component, which is an organic material and therefore is comparatively low in flame retardance. A general approach to improving the flame retardance is to add a flame retardant to the compositions.

Widely used examples of the flame retardant are halogenated flame retardants, such as bromine-containing organic compounds and brominated epoxy resins. These flame retardants can be used in comparatively small amounts to provide thermosetting resin compositions with flame retardance while keeping their electrical and heat-resistance properties.

Substrate materials containing a halogenated flame retardant, however, may generate hydrogen halide or other harmful substances when they are burned. The substances are expected to have an adverse effect on the human body and the natural environment, and therefore, the substrate materials are required to be halogen-free. In recent years, it has been proposed to use, as substrate materials, various resin compositions that contain phosphorus-containing compounds in place of the halogenated flame retardants.

For example, PTLs 1 to 5 disclose, as substrate materials, resin compositions made halogen-free by adding phosphorus-containing compounds.

PTL 1 shows a powdered epoxy resin composition containing an epoxy resin, a phenol resin, a phosphor compound, and an inorganic filler surface-treated with a coupling agent.

PTL 2 shows an epoxy resin composition used for an electrical laminate. The composition contains, as essential components, an epoxy resin and a hardener, which is a predetermined modified phenol resin. The composition further contains a phosphorus flame retardant.

PTL 3 shows an epoxy resin composition containing an epoxy compound, a polyphenylene ether, a cyanate ester compound, an organometallic salt, and a phosphorus flame retardant. The epoxy compound has a number-average molecular weight of not more than 1000, at least two epoxy groups per molecule, and no halogen atom. The polyphenylene ether has a number-average molecular weight of not more than 5000.

PTL 4 shows a resin composition containing a low-molecular-weight polyphenylene ether, an epoxy compound, a cyanate compound, a phosphinate-based flame retardant, and a polyphosphate-based flame retardant having a triazine structure. The polyphenylene ether has a number-average molecular weight of 500 to 2000, and an average of 1.5 to 2 hydroxyl groups per molecule. The epoxy compound has an average of at least two epoxy groups per molecule. The cyanate compound has an average of at least two cyanate groups per molecule.

PTL 5 shows a polyphenylene ether resin composition containing a polyphenylene ether resin having a predetermined terminal structure, a cross-linking hardener, a phosphinate-based flame retardant, and a curing catalyst.

CITATION LIST

Patent Literature

PTL 1: Japanese Unexamined Patent Publication No. 2000-344917

PTL 2: Japanese Unexamined Patent Publication No. 2001-261786

PTL 3: Japanese Unexamined Patent Publication No. 2009-73996

PTL 4: Japanese Unexamined Patent Publication No. 2011-52165

PTL 5: Japanese Unexamined Patent Publication No. 2010-53178

SUMMARY OF THE INVENTION

The present invention provides a thermosetting resin composition excellent in heat resistance and flame retardance when hardened, a prepreg containing the composition, a metal-clad laminate formed by using the prepreg, and a printed circuit board formed by using the laminate.

The thermosetting resin composition according to the present invention contains a thermosetting resin, a hardener that reacts with the thermosetting resin, and a flame retardant. The flame retardant contains a first phosphor compound, which is compatible with a mixture of the thermosetting resin and the hardener, and a second phosphor compound, which is incompatible with the mixture.

The prepreg according to the present invention contains a fibrous base member and the above-mentioned thermosetting resin composition impregnated into the fibrous base member. The metal-clad laminate according to the present invention includes an insulating layer, which is formed by hardening the above-mentioned prepreg, and a metal foil laminated on the insulating layer. The printed circuit board according to the present invention includes the insulating layer and a conductor pattern formed on the insulating layer.

The hardened material of the thermosetting resin composition is excellent in heat resistance and flame retardance. Similarly, the prepreg containing the composition, the metal-clad laminate formed by using the prepreg, and the printed circuit board formed by using the laminate are all excellent in heat resistance and flame retardance.

DESCRIPTION OF EMBODIMENTS

Figure 1:
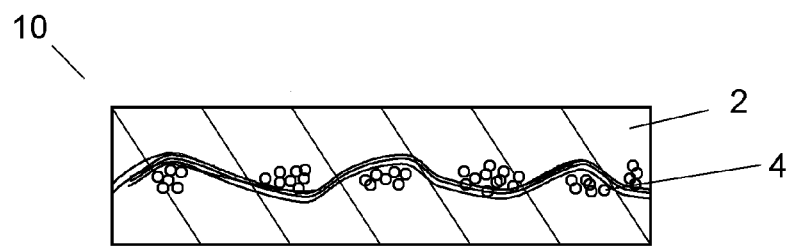
FIG. 1 is a schematic sectional view of a prepreg according to exemplary embodiments of the present invention.

Conventional disadvantages will now be briefly described prior to describing exemplary embodiments of the present invention. Substrate materials used for the insulating layer of printed circuit boards are increasingly required to have various properties to deal with the development of packaging technology, such as higher packing densities of semiconductor devices, higher wiring densities, and more multilayered structure. More specifically, for example, the hardened material is required to have much higher flame retardance while maintaining its excellent heat resistance. In the case of improving the flame retardance of the hardened material by using a phosphorus-containing compound as a flame retardant, it is considered effective to increase the phosphorus atom content of the thermosetting resin composition. In short, it is considered effective to increase the flame retardant content of the composition. Merely increasing the flame retardant content can improve the flame retardance, but may decrease dielectric properties, such as dielectric constant and dielectric loss tangent of the thermosetting resin composition, and the heat resistance of the hardened material.

The inventors of the present invention have studied to improve flame retardance by using various phosphorus-containing compounds. They have found out that a specific combination of different phosphorus-containing compounds can greatly improve the flame retardance of the hardened material much more than expected from the content of the phosphorus atoms in the thermosetting resin composition. The thermosetting resin composition according to the exemplary embodiments of the present invention will be described below based on the results of the further study regarding the effect. Note that the present invention is not limited to the following exemplary embodiments, and that in the following description, the thermosetting resin composition is abbreviated as the "TRC".

The TRC according to the present invention contains a thermosetting resin, a hardener, and a flame retardant. The flame retardant contained in the TEC contains a first phosphor compound, which is compatible with a mixture of the thermosetting resin and the hardener, and a second phosphor compound, which is incompatible with the mixture.

The thermosetting resin used in the present exemplary embodiment can be any thermosetting compound and is not particularly limited. Examples of the thermosetting resin include those contained in the TRCs used in printed circuit boards. More specific examples include epoxy compounds, such as epoxy resins, phenol resins, benzoxazine compounds, imide resins, polyphenylene ether compounds, and modified polyphenylene ethers.

The epoxy compounds can be anything and are not particularly limited as long as they are used as material of various kinds of substrates for laminates and circuit boards. Specific examples of the epoxy compounds include the following: bisphenol ones, such as bisphenol A ones; phenol novolak ones; dicyclopentadiene ones; cresol novolak ones; bisphenol A novolak ones; and naphthalene ring-containing ones. Other examples of the epoxy compounds are epoxy resins, which are polymers of the above-listed epoxy compounds. Preferable among the resins are bisphenol ones, such as bisphenol A ones, and phenol novolak ones. It is preferable that the epoxy compounds have an epoxy equivalent of 100 to 500.

The phenol resins can be anything and are not particularly limited as long as they are used as material of various kinds of substrates for laminates and circuit boards. Specific examples include the following: phenol novolak resins, cresol novolak resins, aromatic hydrocarbon formaldehyde resins, modified phenol resins, dicyclopentadiene-phenol adduct resins, phenol aralkyl resins, cresol aralkyl resins, naphthol aralkyl resins, biphenyl-modified phenol aralkyl resins, phenol trimethylol methane resins, tetraphenylol ethane resins, naphthol novolak resins, naphthol-phenol co-condensed novolak resins, naphthol-cresol co-condensed novolak resins, biphenyl-modified phenol resins, and aminotriazine-modified phenol resins.

The benzoxazine compounds have a benzoxazine ring in the molecule. Specific examples of the compounds include P-d type benzoxazine compounds, which are made from a diamine compound, a phenol compound, and a formaldehyde; and F-a type benzoxazine compounds, which are made from a bisphenol compound, aniline, and a formaldehyde.

The imide resins can be maleimide compounds that are hardened by addition polymerization. Examples of the compounds include polyfunctional maleimide compounds having at least two maleimide groups per molecule, such as bismaleimide compounds.

The polyphenylene ether compounds have a polyphenylene ether chain in the molecule and phenolic hydroxyl groups at the terminal. The modified polyphenylene ethers are compounds in which the terminal hydroxyl groups of the polyphenylene ether compounds have been replaced by functional groups having unsaturated double bonds or other reactive functional groups, such as epoxy groups.

The thermosetting resins may be used alone or in combination of two or more.

The hardener participates in the hardening reaction with the thermosetting resin to produce the hardened material and is therefore preferably a compound capable of reacting with the thermosetting resin. The hardener can be selected according to the type of the thermosetting resin compound to be used.

As mentioned above, the flame retardant contains the first phosphor compound, which is compatible with the mixture of the thermosetting resin and the hardener, and the second phosphor compound, which is incompatible with the mixture.

The first phosphor compound can be any phosphor compound and is not particularly limited as long as it acts as a flame retardant and is compatible with the mixture of the thermosetting resin and the hardener. The term "compatible" means being in a finely dispersed stated on the molecular level in the mixture of the thermosetting resin and the hardener. Examples of the first phosphor compound include the following: phosphate ester compounds, phosphazene compounds, phosphite ester compounds, and phosphine compounds. Examples of the phosphazene compounds include cyclic and chain phosphazene compounds. The cyclic phosphazene compounds, also called cyclophosphazenes, have a cyclic structure in which phosphorus-nitrogen double bonds are present in the molecule. Example of the phosphate ester compounds include the following: triphenyl phosphate; tricresyl phosphate; xylenyl-diphenyl phosphate; cresyl-diphenyl phosphate; 1,3-phenylenebis(di-2,6-xylenyl phosphate); 9,10-dihydro-9-oxa-10-phosphaphenanthrene-10-oxide (DOPO); condensed phosphate compounds such as aromatic condensed phosphate compounds; and cyclic phosphate compounds. Examples of the phosphite ester compounds include trimethylphosphite and triethylphosphite. Examples of the phosphine compounds include tris-(4-methoxyphenyl)phosphine and triphenylphosphine. The above-listed examples of the first phosphor compound may be used alone or in combination of two or more.

The second phosphor compound can be any phosphor compound and is not particularly limited as long as it acts as a flame retardant and is incompatible with the mixture of the thermosetting resin and the hardener. The term "incompatible" means being dispersed like discrete islands in the mixture of the thermosetting resin and the hardener. Examples of the second phosphor compound include phosphinate compounds, polyphosphate compounds, and phosphonium salt compounds. Examples of the phosphinate compounds include the following: aluminum dialkylphosphinate, aluminum tris-(diethylphosphinate), aluminum tris-(methylethylphosphinate), aluminum tris-(diphenylphosphinate), zinc bis-(diethylphosphinate), zinc bis-(methylphosphinate), zinc bis-(diphenylphosphinate), titanyl bis-(diethylphosphinate), titanyl bis-(methylethylphosphinate), and titanyl bis-(diphenylphosphinate). Examples of the polyphosphate compounds include melamine polyphosphate, melam polyphosphate, and melem polyphosphate. Examples of the phosphonium salt compounds include tetraphenylphosphonium tetraphenylborate. The above-listed examples of the second phosphor compound may be used alone or in combination of two or more.

By using the first and second phosphor compounds together as a flame retardant, the hardened material of the TRC according to the present exemplary embodiment has higher flame retardance than in the case of using either one of them alone. The concurrent use of the first and second phosphor compounds can also reduce the influence on the hardening reaction between the thermosetting resin and the hardener. Furthermore, the first and second phosphor compounds seem to produce a synergistic effect to improve the flame retardance of the hardened material. The reduction of the influence on the hardening reaction seems to suppress a decrease in the heat resistance of the hardened material. In addition, these advantages are considered to improve the heat resistance and flame retardance of the hardened material of the TRC according to the present exemplary embodiment.

If, on the other hand, one of the first and second phosphor compounds is used alone as a flame retardant, it needs to be used in a large amount to obtain the same level of flame retardance as in the case of using both phosphor compounds together. Thus, to achieve the same flame-retardant effect, the total amount of the first and second phosphor compounds used together is smaller than the amount of either one of them used alone. In other words, when the phosphorus atom content of the TRC is the same, the flame-retardant effect is higher in the case of using both phosphor compounds together than in the case of using one of them alone. As described above, merely increasing the amount of a single phosphor compound as a flame retardant probably reduces electrical properties such as electrical insulation and the heat resistance and other properties of the hardened material. In contrast, the concurrent use of the first and second phosphor compounds as a flame retardant in the amounts mentioned below can increase flame retardance while preventing a decrease in electrical properties such as electrical insulation and in the heat resistance and other properties of the hardened material.

The mass ratio of the first phosphor compound to the total of the first and second phosphor compounds is preferably 20% to 80%, inclusive, and more preferably 20% to 50%, inclusive. This mass ratio allows the hardened material of the TRC to have excellent heat resistance and flame retardance, while keeping excellent properties of the thermosetting resin. The reason for this seems to be that the above mass ratio increases the synergistic effect of the first and second phosphor compounds used together as a flame retardant.

In the TRC according to the present exemplary embodiment, the content of the phosphorus atoms is preferably 1.8 to 5.2 parts by mass, inclusive, with respect to 100 parts by mass of the total of the flame retardant and organic components other than the flame retardant, more preferably 1.8 to 5 parts by mass, inclusive, and further more preferably 1.8 to 4.8 parts by mass, inclusive. Thus, it is preferable that the content of the flame retardant satisfy the above-mentioned range of the phosphorus atom content of the TRC. With this content of flame retardant, the hardened material of the TRC has excellent heat resistance and flame retardance. This is probably because this content of flame retardant improves the flame retardance while preventing a decrease in electrical properties such as electrical insulation and in the heat resistance of the hardened material, which are caused by the presence of the flame retardant. Note here that the organic components other than the flame retardant include the thermosetting resin, the hardener, and possibly other additional organic components.

The TRC according to the present exemplary embodiment may contain an additional flame retardant besides the first and second phosphor compounds. In view of being halogen-free, it is preferable that the additional flame retardant is not a halogenated one.

The TRC according to the present exemplary embodiment may contain further additional components, such as a filler and an additive besides the thermosetting resin, the hardener, and the flame retardant.

As mentioned above, the TRC according to the present exemplary embodiment may contain a filler. The filler can be any material that improves the heat resistance and flame retardance of the hardened material of the TRC. The presence of the filler improves the heat resistance, flame retardance, and other properties. Specific examples of the filler include the following: silicas such as spherical silicas; metal oxides such as alumina, titanium oxide, and micas; metal hydroxides such as aluminum hydroxide and magnesium hydroxide; talcs; aluminum borate; barium sulfate; and calcium carbonate. Preferable among them are silicas, micas, and talcs, and most preferable is spherical silicas. The above-listed examples of the filler may be used alone or in combination of two or more. The filler may be either used without or after being surface-treated with a silane coupling agent. Examples of the silane coupling agent include epoxysilanes, aminosilanes, vinylsilanes, and isocyanate-silanes.

In the case of containing a filler, the content of the filler is preferably in a range from 10 to 300 parts by mass, inclusive, with respect to 100 parts by mass of the total of the flame retardant and the organic component other than the flame retardant, and more preferably 30 to 200 parts by mass, inclusive.

As mentioned above, the TRC according to the present exemplary embodiment may further contain an additive. Examples of the additive include the following: defoaming agents such as silicone-based and acrylic-ester-based ones; heat stabilizers; antistatic agents; ultraviolet absorbers; dyes and pigments; lubricants; and dispersants such as wetting dispersants.

When used to form a prepreg, the TRC according to the present exemplary embodiment may be made into a varnish to be impregnated into a base member (fibrous base member) of the prepreg. The varnish-like TRC is formed as follows.

First of all, a base varnish is prepared by adding components dissoluble in an organic solvent into the organic solvent, and dissolving them. The components include the thermosetting resin, the hardener, and the first phosphor compound. Heat can be applied if necessary. Next, the second phosphor compound, which is undissolvable in the organic solvent, and an inorganic filler used when necessary are added to the base varnish and uniformly dispersed using a ball mill, a bead mill, a planetary mixer, a roll mill, or the like. As a result, the TRC is made into a varnish. The organic solvent can be anything that dissolves the thermosetting resin, the hardener, and the first phosphor compound and that does not inhibit the hardening reaction. Specific examples of the solvent include toluene and methyl ethyl ketone (MEK).

Prepreg 10 shown in FIG. 1 can be formed by impregnating the fibrous base member with the TRC according to the present exemplary embodiment. FIG. 1 is a schematic sectional view of prepreg 10. Prepreg 10 includes fibrous base member 4 and TRC 2 impregnated into fibrous base member 4. Thus, prepreg 10 is formed by impregnating fibrous base member 4 with TRC 2. To form prepreg 10, fibrous base member 4 impregnated with varnish-like TRC 2 may be dried.

Examples of fibrous base member 4 used to form prepreg 10 include the following: glass cloth, aramid cloth, polyester cloth, glass nonwoven cloth, aramid nonwoven cloth, polyester nonwoven cloth, pulp, and linter paper. The glass cloth, particularly flattened glass cloth provides the laminate with excellent mechanical strength. One approach to flattening the glass cloth is to continuously apply appropriate pressure using a press roll, thereby compressing the yarn to be flat. Fibrousbase member 4 is most frequently made of glass cloth with a thickness of 0.02 to 0.3 mm.

TRC 2 is impregnated into fibrous base member 4 by soaking or coating. It can be impregnated a number of times if necessary. In this case, impregnation can be repeated using two or more TRCs different in chemical composition and concentration until a desired composition and a desired impregnation amount are obtained.

Fibrous base member 4 impregnated with TRC 2 is heated under desired heating conditions, for example, at a temperature of 80 to 180° C. for a period of 1 to 10 minutes. As a result, semi-hardened (B stage) prepreg 10 is prepared.

Figure 2:
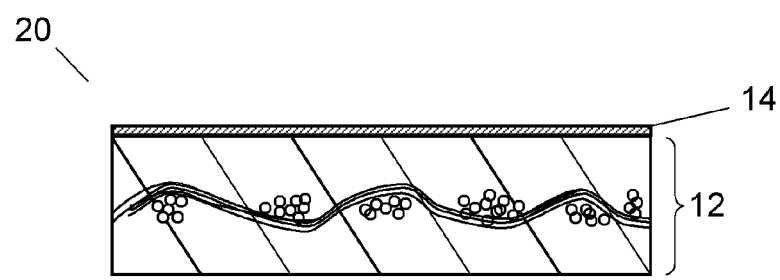
FIG. 2 is a schematic sectional view of a metal-clad laminate according to the exemplary embodiments of the present invention.

Prepreg 10 thus obtained can be used to form metal-clad laminate 20 shown in FIG. 2. FIG. 2 is a schematic sectional view of metal-clad laminate 20. Metal-clad laminate 20 includes insulating layer 12, which is the hardened material of prepreg 10, and metal foil 14 laminated on insulating layer 12.

Metal-clad laminate 20 can be formed as follows. One prepreg 10 is prepared, or two or more prepregs 10 are laminated together. Then, metal foil 14, such as a copper foil is laminated on one or both of the upper and lower sides (faces) of the single or laminated prepregs 10. Next, these components are molded under heat and pressure so as to be integrated into a laminated body with the metal foil on one or both sides. Thus, metal-clad laminate 20 according to the embodiment of the present invention is formed by laminating metal foil 14 on the above-described single or laminated prepregs 10 and molding it under heat and pressure.

The conditions of heat and pressure can be properly determined depending on the thickness of the laminate to be produced or the type of the TRC of prepreg 10. For example, the temperature can be 170 to 210° C., the pressure can be 1.5 to 4.0 MPa, and the time can be 60 to 150 minutes.

The hardened material of the TRC according to the present exemplary embodiment is excellent in heat resistance and flame retardance. Consequently, prepreg 10 containing this TRC can be used to form metal-clad laminate 20 excellent in heat resistance and flame retardance. Similarly, laminate 20 including prepreg 10 can be used to form printed circuit board 30 excellent in heat resistance and flame retardance.

Figure 3:
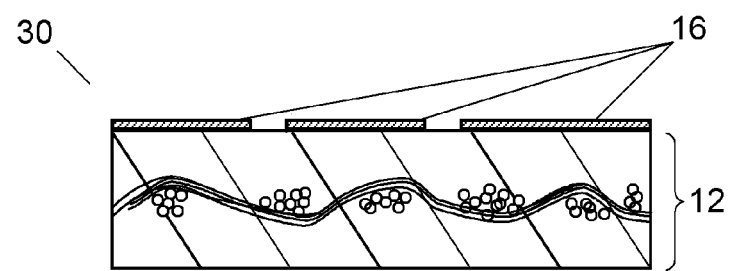
FIG. 3 is a schematic sectional view of a printed circuit board according to the exemplary embodiments of the present invention.

More specifically, metal foil 14 on the surface of metal-clad laminate 20 is etched to form conductor pattern 16 as a circuit on the surface of printed circuit board 30 as shown in FIG. 3. FIG. 3 is a schematic sectional view of printed circuit board 30. Printed circuit board 30 includes insulating layer 12 and conductor pattern 16 formed on insulating layer 12.

In other words, printed circuit board 30 is produced by forming a circuit by partially removing metal foil 14 on the surface of laminate 20. Printed circuit board 30 is excellent in heat resistance and flame retardance.

Specific exemplary embodiments having different combinations of the thermosetting resin and the hardener will be described as follows.

First Exemplary Embodiment

A TRC according to the present exemplary embodiment contains, as a thermosetting resin, a modified polyphenylene ether compound that is terminal-modified by substituents with a carbon-carbon unsaturated double bond. The TRC further contains, as a hardener, a cross-linking hardener with carbon-carbon unsaturated double bonds in the molecule.

The modified polyphenylene ether compound can be any modified polyphenylene ether compound that is terminal-modified by substituents with a carbon-carbon unsaturated double bond. The substituents with the carbon-carbon unsaturated double bond are not particularly limited, but can be, for example, those expressed by Formula (1) below.

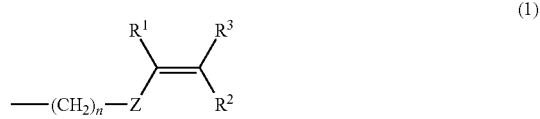

(1)

In Formula (1), n is an integer from 0 to 10; Z is an arylene group; and $R^1$ to $R^3$ are either hydrogen atoms or alkyl groups. $R^1$ to $R^3$ are independent of each other and may be the same or different groups.

In Formula (1), when n is 0, Z is directly bonded to the terminal of the polyphenylene ether.

The arylene group is not particularly limited, and can be, for example, a monocyclic aromatic group such as a phenylene group, or a polycyclic aromatic group such as a naphthalene ring. Other examples of the arylene group include derivatives in which the hydrogen atoms bonded to the aromatic ring are substituted by functional groups such as alkenyl groups, alkynyl groups, formyl groups, alkyl-carbonyl groups, alkenyl-carbonyl groups, or alkynyl-carbonyl groups. The alkyl groups are not particularly limited, but are preferably those having 1 to 18 carbon atoms, and more preferably those having 1 to 10 carbon atoms. Specific examples of the alkyl groups include the following: methyl group, ethyl group, propyl group, hexyl group, and decyl group.

Specific examples of the substituents $R^1$ to $R^3$ include the following: vinylbenzyl groups (ethenyl-benzyl groups) such as p- and m-ethenyl-benzyl group, vinylphenyl group, acrylate group, and methacrylate group.

Preferable examples of the substituents $R^1$ to $R^3$ shown in Formula (1) include vinylbenzyl groups. For example, at least one of the substituents expressed by Formulas (2) and (3) can be used.

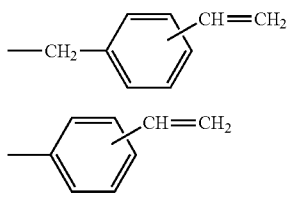

(2)

(3)

Other examples of the substituents with a carbon-carbon unsaturated double bond, which terminal-modify the modified polyphenylene ethers used in the present exemplary embodiment, include (meth) acrylate groups expressed by Formula (4) below.

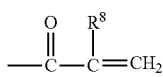

(4)

In Formula (4), $R^8$ is either a hydrogen atom or an alkyl group. The alkyl group is not particularly limited, but is preferably the one having 1 to 18 carbon atoms, and more preferably the one having 1 to 10 carbon atoms. Specific examples of the alkyl group include the following: methyl group, ethyl group, propyl group, hexyl group, and decyl group.

The modified polyphenylene ethers used in the present exemplary embodiment have a polyphenylene ether chain in the molecule, and preferably have repeating units expressed by Formula (5) in the molecule.

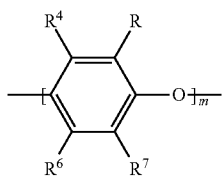

(5)

In Formula (5), m is a natural number from 1 to 50. $R^4$ to $R^7$ are independent of each other and may be the same or different groups. Examples of $R^4$ to $R^7$ include the following: hydrogen atom, alkyl groups, alkenyl groups, alkynyl groups, formyl groups, alkyl-carbonyl groups, alkenyl-carbonyl groups, and alkynyl-carbonyl groups. Preferable among them are hydrogen atom and alkyl groups.

The functional groups mentioned above as examples of $R^4$ to $R^7$ are specifically as follows.

The alkyl groups are not particularly limited, but are preferably those having 1 to 18 carbon atoms, and more preferably those having 1 to 10 carbon atoms. Specific examples include the following: methyl group, ethyl group, propyl group, hexyl group, and decyl group.

The alkenyl groups are not particularly limited, but are preferably those having 2 to 18 carbon atoms, and more preferably those having 2 to 10 carbon atoms. Specific examples include vinyl group, allyl group, and 3-butenyl group.

The alkynyl groups are not particularly limited, but are preferably those having 2 to 18 carbon atoms, and more preferably those having 2 to 10 carbon atoms. Specific examples include ethynyl group and prop-2-en-1-yl group (propargyl group).

The alkyl-carbonyl groups may be any carbonyl group substituted by an alkyl group, but are preferably those having 2 to 18 carbon atoms, and more preferably those having 2 to 10 carbon atoms. Specific examples include the following: acetyl group, propionyl group, butyryl group, isobutyryl group, pivaloyl group, hexanoyl group, octanoyl group, and cyclohexylcarbonyl group.

The alkenyl-carbonyl groups may be any carbonyl group substituted by an alkenyl group, but are preferably those having 3 to 18 carbon atoms, and more preferably those having 3 to 10 carbon atoms. Specific examples include acryloyl group, methacryloyl group, and crotonoyl group.

The alkynyl-carbonyl groups may be any carbonyl group substituted by an alkynyl group, but are preferably those having 3 to 18 carbon atoms, and more preferably those having 3 to 10 carbon atoms. Specific examples include propioloyl group.

The modified polyphenylene ether compound used in the present exemplary embodiment may have any weight-average molecular weight (Mw). It is preferably 500 to 5000, inclusive, more preferably 800 to 4000, inclusive, and further more preferably 1000 to 3000, inclusive. The Mw can be measured by a common method for molecular weight measurement, such as gel permeation chromatography (GPC). When the modified polyphenylene ether compound has the repeating units expressed by Formula (5) in the molecule, it is preferable that m be a numerical value that allows the modified polyphenylene ether compound to have a Mw in the above-mentioned range. Specifically, m is preferably within a range from 1 to 50.

When the Mw of the modified polyphenylene ether compound is in the above-mentioned range, the hardened material has the excellent dielectric properties of the polyphenylene ether, and is also excellent in moldability as well as heat resistance. The reason for this seems to be the following. Common polyphenylene ethers have a comparatively low molecular weight when the Mw is in the above-mentioned range. As a result, the hardened material tends to have low heat resistance. In contrast, the modified polyphenylene ether compound, which has the unsaturated double bond at the terminal, can form hardened materials with sufficient heat resistance. Furthermore, when the Mw of the modified polyphenylene ether compound is in the above-mentioned range, the compound has high moldability because of its comparatively low molecular weight. Therefore, the modified polyphenylene ether compound can form a hardened material with not only excellent heat resistance, but also good moldability.

The average number of substituents at the terminal (the number of terminal functional groups) per molecule of the modified polyphenylene ether of the modified polyphenylene ether compound is not particularly limited. It is preferably 1 to 5, inclusive, more preferably 1 to 3, inclusive, and further more preferably 1.5 to 3, inclusive.

When the number of terminal functional groups is too small, the hardened material tends to have insufficient heat resistance. When, on the other hand, the number is too large, the reactivity is too high, possibly causing problems such as a decrease in the storage stability or fluidity of the TRC. Thus, using the modified polyphenylene ether with insufficient fluidity may cause molding defects such as voids in the case of multilayer molding, and it becomes unlikely to form a reliable printed circuit board.

The number of terminal functional groups of the modified polyphenylene ether compound can be, for example, the average number of substituents per molecule of the modified polyphenylene ether compound present in its 1 mole. The number of terminal functional groups can be determined by, for example, calculating the number of hydroxyl groups remaining in the obtained modified polyphenylene ether compound, and then subtracting it from the number of hydroxyl groups in the unmodified polyphenylene ether. The difference between the two numbers is the number of terminal functional groups. The number of hydroxyl groups remaining in the modified polyphenylene ether compound can be determined by adding a quaternary ammonium salt (tetraethylammonium hydroxide), which can be associated with the hydroxyl group, to a solution of the modified polyphenylene ether compound, and by measuring the UV absorbance of the mixed solution.

The modified polyphenylene ether compound used in the present exemplary embodiment may have any intrinsic viscosity. It only needs to be 0.03 to 0.12 dl/g, preferably 0.04 to 0.11 dl/g, and more preferably 0.06 to 0.095 dl/g. When the intrinsic viscosity is too low, the molecular weight tends to be low, making it unlikely to obtain low dielectric properties such as a low dielectric constant and a low dielectric loss tangent. When the intrinsic viscosity is too high, on the other hand, the fluidity of the TRC is insufficient due to its high viscosity, which is likely to reduce the moldability of the hardened material. Thus, when the modified polyphenylene ether compound has an intrinsic viscosity in the above-mentioned range, the resultant hardened material has excellent heat resistance and moldability.

The above-mentioned intrinsic viscosity is measured in a methylene chloride at 25° C. More specifically, it is measured in 0.18 g/45 ml of methylene chloride solution (solution temperature: 25° C.) using a viscometer. One example of the viscometer is Visco System AVS 500 available from Schott.

The method of synthesizing the modified polyphenylene ether compound can be anything as long as the compound can be terminal-modified by a substituent with a carbon-carbon unsaturated double bond. One specific method is to make a polyphenylene ether react with a compound including a substituent with the carbon-carbon unsaturated double bond and a halogen atom.

The compound including the substituent with the carbon-carbon unsaturated double bond and the halogen atom can be, for example, a compound expressed by Formula (6) below.

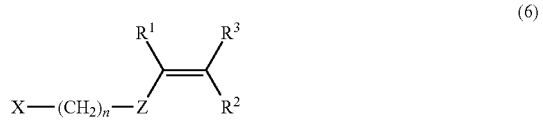

(6)

In Formula (6), n, Z, and $R^1$ to $R^3$ are identical to those in Formula (1). Namely, n is a natural number from 0 to 10; Z is an arylene group; and $R^1$ to $R^3$ are independent of each other and may be the same or different groups. $R^1$ to $R^3$ are either hydrogen atoms or alkyl groups. X is a halogen atom, such as a chlorine atom, a bromine atom, an iodine atom, or a fluorine atom. Preferable among them is a chlorine atom.

The above-listed examples of the compound expressed by Formula (6) may be used alone or in combination of two or more.

Examples of the compound including the substituent with the carbon-carbon unsaturated double bond and the halogen atom include p- and m-chloromethylstyrenes.

The polyphenylene ether as a raw material can be anything and is not particularly limited as long as it can be finally turned into a predetermined modified polyphenylene ether. Specifically, the raw material is mainly composed of the polyphenylene ether including a polyphenylene ether made from 2,6-dimethylphenol and at least one of bi- and tri-functional phenols, or poly(2,6-dimethyl-1,4-phenylene oxide). A bifunctional phenol is a phenol compound with two phenolic hydroxyl groups per molecule such as a tetramethyl bisphenol A. A trifunctional phenol is a phenol compound with three phenolic hydroxyl groups per molecule. One specific example of those polyphenylene ethers is expressed by Formula (7) below.

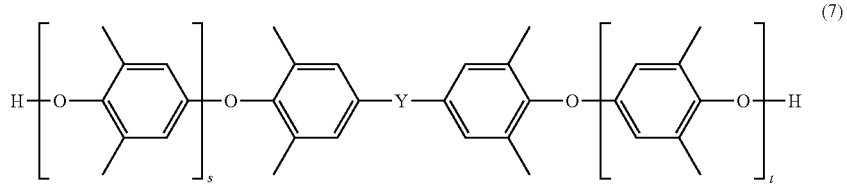

(7)

In Formula (7), the sum of s and t is preferably from 1 to 30, inclusive, and each of s and t is preferably from 0 to 20, inclusive. In other words, it is preferable that each of s and t be between 0 and 20, inclusive and that a total of s and t be between 1 and 30, inclusive. Y is either an alkylene group having 1 to 3 carbon atoms or a direct bond. One example of the alkylene group is a dimethylmethylene group.

One method of synthesizing the modified polyphenylene ether compound is described above. More specifically, the above-mentioned polyphenylene ether and a compound expressed by Formula (6) are dissolved and stirred in a solvent so as to react with each other. This results in the formation of the modified polyphenylene ether used in the present exemplary embodiment.

This reaction is preferably performed in the presence of an alkali metal hydroxide, which is considered to promote the reaction. This is probably because the alkali metal hydroxide functions as a dehydrohalogenation agent, more specifically as a dehydrochlonation agent. In other words, the alkali metal hydroxide removes hydrogen halide (hydrogen chloride) from the phenolic groups in the polyphenylene ether and the compound expressed by Formula (6). As a result, instead of the hydrogen atoms of the phenolic groups in the polyphenylene ether, the substituents expressed by Formula (1) are bonded to the oxygen atoms of the phenolic groups.

The alkali metal hydroxide can be anything that can function as a dehalogenation agent, such as a sodium hydroxide. The alkali metal hydroxide is usually used as an aqueous solution, namely as an aqueous sodium hydroxide.

The reaction conditions such as time and temperature are different depending on the compound expressed by Formula (6) and are not limited as long as the reaction proceeds smoothly. The reaction temperature is preferably from room temperature to 100° C., and more preferably from 30 to 100° C. The reaction time is preferably from 0.5 to 20 hours, and more preferably from 0.5 to 10 hours.

The solvent used for the reaction can be anything that can dissolve the polyphenylene ether and the compound expressed by Formula (6) and that does not inhibit the reaction between them. One specific example is toluene.

The above-mentioned reaction is preferably performed in the presence of not only the alkali metal hydroxide but also a phase-transfer catalyst. In other words, it is preferable to perform the above-mentioned reaction in the presence of the alkali metal hydroxide and the phase-transfer catalyst. The reaction proceeds smoothly in the presence of both of them probably for the following reason.

The phase-transfer catalyst, which has the function of acquiring the alkali metal hydroxide, is soluble both in the polar solvent phase such as water, and in the nonpolar solvent phase such as an organic solvent. More specifically, assume that an aqueous solution of sodium hydroxide is used as the alkali metal hydroxide, and an organic solvent such as toluene, which is incompatible with water, is used as the solvent. In this case, when the aqueous solution of sodium hydroxide is dropped into the solvent used in the reaction, they are not mixed well. As a result, the sodium hydroxide is unlikely to be transferred to the solvent. Consequently, the aqueous solution of sodium hydroxide added as the alkali metal hydroxide does not sufficiently contribute to promoting the reaction.

In contrast, when the polyphenylene ether is reacted with the compound expressed by Formula (6) in the presence of the alkali metal hydroxide and the phase-transfer catalyst, the alkali metal hydroxide is taken into the catalyst and transferred to the solvent, thereby contributing to promoting the reaction more easily. This is considered to be the reason why the reaction proceeds smoothly in the presence of the alkali metal hydroxide and the phase-transfer catalyst.

The phase-transfer catalyst is not particularly limited, and can be, for example, a quaternary ammonium salt, such as a tetra-n-butylammonium bromide.

The TRC according to the present exemplary embodiment preferably includes the above-acquired modified polyphenylene ether as the modified polyphenylene ether.

The cross-linking hardener used in the present exemplary embodiment can be anything that has carbon-carbon unsaturated double bonds in the molecule. In other words, the hardener can be anything that can react with the modified polyphenylene ether compound and harden it by forming a cross-link. The hardener is preferably a compound with two carbon-carbon unsaturated double bonds or more in the molecule.

The weight-average molecular weight (Mw) of the cross-linking hardener used in the present exemplary embodiment is preferably 100 to 5000, inclusive, more preferably 100 to 4000, inclusive, and further more preferably 100 to 3000, inclusive. A cross-linking hardener having a too small Mw may easily volatilize from the components of the TRC. A cross-linking hardener having a too large Mw may increase the viscosity of the varnish-like TRC or the melt viscosity at the time of hot forming. When the Mw of the hardener is in the above-mentioned range, the resultant TRC can be used to form a hardened material with excellent heat resistance. The reason for this is considered that a cross-link can be formed well by the reaction between the hardener and the modified polyphenylene ether compound. Note that the Mw can be measured by a common method for molecular weight measurement, such as gel permeation chromatography (GPC).

The average number of the carbon-carbon unsaturated double bonds in the molecule (the number of terminal double bonds) of the cross-linking hardener used in the present exemplary embodiment differs depending on the Mw of the cross-linking hardener. It is preferably 1 to 20, and more preferably 2 to 18. When the number is too small, the hardened material tends to have insufficient heat resistance. When, on the other hand, the number is too large, the reactivity is too high, possibly causing problems, such as a decrease in the storage stability or in the fluidity of the TRC.

In further consideration of the Mw of the cross-linking hardener, the number of terminal double bonds is preferably 1 to 4 when the Mw is less than 500 (for example, 100 or more and less than 500). When the Mw is 500 or more (for example, 500 to 5000, inclusive), the number of terminal double bonds is preferably 3 to 20. In the respective cases, when the number of terminal double bonds is smaller than the above-mentioned range, the hardener may have low reactivity, making the hardened material of the TRC have a low crosslink density, possibly making the heat resistance and the glass transition point (Tg) insufficient. When, on the other hand, the number of terminal double bonds is larger than the above-mentioned range, the TRC may gelate easily.

The number of terminal double bonds can be found from the product specification value of the cross-linking hardener to be used. One example of the number of terminal double bonds is the average number of double bonds per molecule of the hardener present in its one mole.

Examples of the cross-linking hardener used in the present exemplary embodiment include the following: trialkenyl isocyanurate compounds such as triaryl isocyanurates (TAIL); polyfunctional methacrylate compounds with two or more methacrylic groups in the molecule; polyfunctional acrylate compounds with two or more acrylic groups in the molecule; vinyl compounds (polyfunctional vinyl compounds) with two or more vinyl groups in the molecule such as polybutadienes; and vinylbenzyl compounds with vinylbenzyl groups in the molecule such as styrene and divinylbenzene. Preferable among them are those with two or more carbon-carbon double bonds in the molecule.

Specific examples include the following: trialkenyl isocyanurate compounds, polyfunctional acrylate compounds, polyfunctional methacrylate compounds, polyfunctional vinyl compounds, and divinylbenzene compounds. They are considered to promote the hardening reaction to form a cross-link, thereby improving the heat resistance of the hardened body of the TRC. Examples of the cross-linking hardener may be used alone or in combination of two or more. It is also possible to concurrently use a compound with two or more carbon-carbon unsaturated double bonds in the molecule and a compound with one carbon-carbon unsaturated double bond in the molecule. The compound with one carbon-carbon unsaturated double bond in the molecule can be, for example, a compound (monovinyl compound) with one vinyl group in the molecule.

The content of the modified polyphenylene ether compound is preferably in a range from 30 to 90 parts by mass, inclusive, with respect to 100 parts by mass of the total of the modified polyphenylene ether compound and the cross-linking hardener and more preferably 50 to 90 parts by mass, inclusive. The content of the hardener is preferably in a range from 10 to 70 parts by mass, inclusive, with respect to 100 parts by mass of the total of the compound and the hardener, and more preferably 10 to 50 parts by mass, inclusive. In other words, the ratio of the compound with respect to the hardener is preferably in a mass ratio of 90:10 to 30:70, and more preferably in a mass ratio of 90:10 to 50:50. As long as the contents of the compound and the hardener are within the above-mentioned range, the resultant TRC can be used to form a hardened material excellent in heat resistance and flame retardance. This is considered to be due to the smooth progress of the hardening reaction between the compound and the hardener.

The flame retardant used in the present exemplary embodiment contains the first phosphor compound which is compatible with the mixture of the modified polyphenylene ether compound and the cross-linking hardener, and the second phosphor compound which is incompatible with the mixture. Specific examples of the first and second phosphor compounds have been mentioned above.

The TRC according to the present exemplary embodiment may further contain a reaction initiator. Although the hardening reaction of the TRC according to the present exemplary embodiment can proceed without a reaction initiator or a cross-linking hardener, it is difficult, under certain process conditions, to increase the temperature high enough to achieve the hardening of the TRC. This is why the reaction initiator may be added. The reaction initiator can be anything that can promote the hardening reaction between the modified polyphenylene ether and the hardener. Specific examples of the reaction initiator include the following oxidizing agents: α,α'-bis(t-butylperoxy-m-isopropyl)benzene, 2,5-dimethyl-2,5-di(t-butylperoxy)-3-hexyne, benzoyl peroxide, 3,3',5,5'-tetramethyl-1,4-diphenoquinone, chloranil, 2,4,6-tri-t-butylphenoxyl, t-butylperoxyisopropyl monocarbonate, and azobisisobutyronitrile.

It is possible to use, for example, a metal carboxylate together with the reaction initiator when necessary so as to further promote the hardening reaction. Preferable among the above-listed examples of the reaction initiator is α,α'-bis(t-butylperoxy-m-isopropyl)benzene for the following reasons. For one thing, α,α'-bis(t-butylperoxy-m-isopropyl)benzene has a comparatively high reaction-initiating temperature and hence can prevent the promotion of the hardening reaction when the prepreg does not need to be hardened, such as when it is dried, thereby suppressing a decrease in the storage stability of the TRC. For another, α,α'-bis(t-butylperoxy-m-isopropyl)benzene has low volatility and does not volatilize when the prepreg is dried or stored, thereby providing high stability. The above-listed examples of the reaction initiator may be used alone or in combination of two or more.

The TRC according to the present exemplary embodiment may further contain other components, such as a filler or an additive, of which specific examples have been mentioned above.

In the TRC according to the present exemplary embodiment, the modified polyphenylene ether compound has a polyphenylene ether structure with excellent dielectric properties, so that the hardened material has also excellent dielectric properties. The compound and the cross-linking hardener are hardened by the addition polymerization of the unsaturated double bonds. This hardening reaction does not produce any polar groups such as hydroxyl groups. This seems to be the reason why the hardened material of the TRC according to the present exemplary embodiment has excellent dielectric properties. In addition, the TRC according to the present exemplary embodiment, which contains the first and second phosphor compounds as a flame retardant, has higher flame retardance than a conventional case where phosphor compounds are used. This results in forming a hardened material with excellent heat resistance and flame retardance while maintaining the excellent dielectric properties of the resin component. Therefore, the use of prepreg 10 containing this TRC can produce metal-clad laminate 20 excellent in dielectric properties, heat resistance, and flame retardance. Similarly, the use of metal-clad laminate 20 can produce printed circuit board 30 excellent in dielectric properties, heat resistance, and flame retardance.

The advantageous effects of the present exemplary embodiment will be described in greater detail below as Examples. Note that the present invention is not limited to these Examples.

Examples X-1 to X-17 and Comparative Examples X-1 to X-4

The following is a description of each component used to form the TRC in these Examples.

Polyphenylene Ether Compound: PPE Component

As the polyphenylene ether compound, modified PPE-1 to PPE-4 and unmodified PPE-1 and PPE-2 described below are used.

Modified PPE-1 is SA9000 available from SABIC Innovative Plastics, which is a modified polyphenylene ether obtained by modifying the terminal hydroxyl groups in the polyphenylene ether by methacrylic groups. Modified PPE-1 has a weight-average molecular weight (Mw) of 1700 and two terminal functional groups.

Modified PPE-2 is a modified polyphenylene ether obtained by making a polyphenylene ether react with a chloromethylstyrene as described in detail as follows.

First, a one-liter three-necked flask is prepared, which is equipped with a temperature controller, a stirrer, a cooling device, and a dropping funnel. Next, the flask is filled with 200 g of polyphenylene ether, 30 g of mixture of p- and m-chloromethylstyrenes in the mass ratio of 50:50, 1.227 g of tetra-n-butylammonium bromide as a phase-transfer catalyst, and 400 g of toluene. As the polyphenylene ether, SA90 is used, which is available from SABIC Innovative Plastics and has a Mw of 1700 and two terminal hydroxyl groups. As the mixture of the chloromethylstyrenes, a chloromethylstyrene (CMS) is used, which is available from Tokyo Chemical Industry Co., Ltd.

The contents are stirred until the polyphenylene ether, the chloromethylstyrenes, and the tetra-n-butylammonium bromide are dissolved in the toluene. During the stirring process, the contents are gradually heated until the solution temperature reaches 75° C. Next, as the alkali metal hydroxide, an aqueous solution of sodium hydroxide (20 g of sodium hydroxide/20 g of water) is dropped in the solution for 20 minutes. Then the solution is stirred for 4 hours at 75° C.

Next, the contents of the flask are neutralized with 10% by mass of hydrochloric acid, and a large amount of methanol is added thereto. As a result, a precipitation occurs in the liquid in the flask. In other words, the product contained in the reaction solution in the flask is reprecipitated. The precipitate is taken out by filtration, washed three times with a mixture of methanol and water in the mass ratio of 80:20, and dried under reduced pressure for three hours at 80° C.

The resultant solid material is analyzed by $^1$H-NMR (400 MHz, CDC13, TMS), and it is confirmed that there is a peak due to vinylbenzyl groups (ethenyl-benzyl groups) at 5 to 7 ppm. As a result, the resultant solid material is confirmed to be a modified polyphenylene ether that has vinylbenzyl groups as substituents in the molecule at the terminals. More specifically, the resultant solid material is an ethenyl-benzylated polyphenylene ether.

The number of terminal functional groups in the modified polyphenylene ether is measured as follows. First, the modified polyphenylene ether is weighed accurately. The weight in this case is referred to as X (mg). The weighed modified polyphenylene ether is dissolved in 25 ml of methylene chloride. To the solution is added 100 µl of ethanol solution of 10% by mass of tetraethylammonium hydroxide (TEAH). The ethanol solution, which contains TEAH and ethanol in the volume ratio of 15:85, is prepared by mixing 85 parts by volume of ethanol and 15 parts by volume of TEAH in advance. Next, the absorbance (Abs) at 318 nm is measured by a UV spectrophotometer (UV-1600 available from Shimadzu Corporation). From the measurement result, the number of terminal hydroxyl groups in the modified polyphenylene ether is calculated using the formula below.

$$\text{The amount of residual OH (µmol/g)} = [(25 \times \text{Abs})/(\in \times \text{OPL} \times X)] \times 10^6,$$

where $\in$ is an adsorption coefficient, the value thereof is 4700 l/mol·cm. OPL is an optical path length of the cell, the value thereof is 1 cm.

The calculated amount of residual OH (the number of terminal hydroxyl groups) in the modified polyphenylene ether is almost zero, which indicates that most of the hydroxyl groups in the unmodified polyphenylene ether is modified. The difference in the number of terminal hydroxyl groups before and after the modification is equal to the number of terminal hydroxyl groups in the unmodified polyphenylene ether. In other words, the number of terminal hydroxyl groups in the unmodified polyphenylene ether corresponds to the number of terminal functional groups in the modified polyphenylene ether. The number of terminal functional groups is two.

In addition, the intrinsic viscosity (IV) of the modified polyphenylene ether in the methylene chloride at 25° C. is measured. More specifically, as the IV of the modified polyphenylene ether, 0.18 g/45 ml of methylene chloride solution (solution temperature: 25° C.) of the modified polyphenylene ether is measured using a viscometer. The viscometer is Visco System AVS 500 available from Schott. The IV of the modified polyphenylene ether is found to be 0.086 dl/g.

The molecular weight distribution of the modified polyphenylene ether is measured by GPC. The resultant molecular weight distribution is used to calculate the Mw, which is found to be 1900.

Modified PPE-3 is synthesized in the same manner as modified PPE-2 except for using the conditions and polyphenylene ether that will be described below.

The polyphenylene ether used for modified PPE-3 is SA120 available from SABIC Innovative Plastics. SA120 has an IV of 0.125 dl/g, one terminal hydroxyl group, and a Mw of 2400.

In this case, 200 g of polyphenylene ether (SA120), 15 g of CMS, and 0.92 g of phase-transfer catalyst (tetra-n-butylammonium bromide) are used. Also, an aqueous solution of sodium hydroxide (10 g of sodium hydroxide/10 g of water) is used instead of the above-mentioned aqueous solution of sodium hydroxide (20 g of sodium hydroxide/20 g of water). The other conditions for modified PPE-3 are identical to those for modified PPE-2.

The resultant solid material is analyzed by $^1$H-NMR (400 MHz, CDC13, TMS), and it is confirmed that there is a peak due to ethenyl-benzyl groups at 5 to 7 ppm. As a result, the resultant solid material is confirmed to be a modified polyphenylene ether that has vinylbenzyl groups as substituents in the molecule. More specifically, the resultant solid material is an ethenyl-benzylated polyphenylene ether.

The number of terminal functions of the modified polyphenylene ether is found to be one when measured in the same manner as described above.

The IV of the modified polyphenylene ether in the methylene chloride at 25° C. is found to be 0.125 dl/g when measured in the same manner as described above.

The Mw of the modified polyphenylene ether is found to be 2800 when measured in the same manner as described above.

Modified PPE-4 is synthesized in the same manner as modified PPE-2 except for using the conditions and polyphenylene ether that will be described below.

The polyphenylene ether used in this case is prepared by dividing and rearranging molecules of Noryl 640-111, which is available from SABIC Innovative Plastics. Noryl 640-111 has an IV of 0.45 dl/g, one terminal hydroxyl group, and a Mw of 47000. The division and rearrangement are performed as follows.

In this case, 200 g of Noryl 640-111, 65 g of bisphenol A as a phenol species, 65 g of benzoyl peroxide (Nyper BW available from NOF Corporation) as an initiator are weighed, and then 400 g of toluene is added as a solvent. These are mixed for one hour at 90° C. This results in a polyphenylene ether whose molecules is divided and rearranged and which has five terminal hydroxyl groups and a Mw of 2000.

Next, 200 g of the polyphenylene ether whose molecules is divided and rearranged, 65 g of CMS, and 1.92 g of tetra-n-butylammonium bromide as a phase-transfer catalyst are used. Also, an aqueous solution of sodium hydroxide (40 g of sodium hydroxide/40 g of water) is used instead of the above-mentioned aqueous solution of sodium hydroxide (20 g of sodium hydroxide/20 g of water). The other conditions for modified PPE-4 are identical to those for modified PPE-2.

The resultant solid material is analyzed by $^1$H-NMR (400 MHz, CDC13, TMS), and it is confirmed that there is a peak due to ethenyl-benzyl groups at 5 to 7 ppm. As a result, the resultant solid material is confirmed to be a modified polyphenylene ether that has vinylbenzyl groups as substituents in the molecule. More specifically, the resultant solid material is an ethenyl-benzylated polyphenylene ether.

The number of terminal functions of the modified polyphenylene ether is found to be five when measured in the same manner as described above.

The IV of the modified polyphenylene ether in the methylene chloride at 25° C. is found to be 0.068 dl/g when measured in the same manner as described above.

The Mw of the modified polyphenylene ether is found to be 2000 when measured in the same manner as described above.

Unmodified PPE-1 is SA120 available from SABIC Innovative Plastics, which is a polyphenylene ether having a hydroxyl group at the terminal. Unmodified PPE-1 has an IV of 0.125 dl/g, one terminal hydroxyl group, and a Mw of 2600.

Unmodified PPE-2 is Noryl 640-111 available from SABIC Innovative Plastics, which is also a polyphenylene ether having a hydroxyl group at the terminal. Noryl 640-111 has an IV of 0.45 dl/g, one terminal hydroxyl group, and a Mw of 47000.

Cross-Linking Hardener

As cross-linking hardeners, TAIL, a styrene monomer, dicyclopentadiene methacrylate (DCP), divinylbenzene (DVB), and a polybutadiene oligomer are used.

TAIL, which is available from Nippon Kasei Chemical Co., Ltd., has a Mw of 249 and three terminal double bonds.

The styrene monomer has a molecular weight of 104 and one terminal double bond.

The DCP, which is available from Shin-Nakamura Chemical Co., Ltd., has a Mw of 332 and two terminal double bonds.

The DVB, which is DVB 810 available from Nippon Steel & Sumitomo Metal Corporation, has a molecular weight of 130 and two terminal double bonds.

The polybutadiene oligomer is B1000 available from Nippon Soda Co., Ltd., which has a Mw of 1100 and 15 terminal double bonds.

First Phosphor Compound

As the first phosphor compounds, a phosphate compound and a phosphazene compound are used.

The phosphate compound is PX-200 available from Daihachi Chemical Industry Co., Ltd., which is an aromatic condensed phosphate compound having 9% by mass of phosphorus concentration.

The phosphazene compound is SPB-100 available from Otsuka Chemical Co., Ltd., which is a cyclic phosphazene compound having 13% by mass of phosphorus concentration.

Second Phosphor Compound

As the second phosphor compounds, a phosphinate compound and a polyphosphate compound are used.

The phosphinate compound is Exolit OP-935 available from Clariant (Japan) K.K., which is a aluminum tris(diethylphosphinate) having 23% by mass of phosphorus concentration.

The polyphosphate compound is Melapur 200 available from BASF, which is a melamine polyphosphate having 13% by mass of phosphorus concentration.

Reaction Initiator

The reaction initiator used is Perbutyl P available from NOF Corporation, which is 1,3-bis(butylperoxyisopropyl)benzene.

[Production Process]

All components are added to toluene in ratios shown in Tables 1 to 3 so as to have 60% by mass of solid component concentration, and then mixed together. The mixture is stirred for 60 minutes to form a varnish-like TRC (a varnish).

Next, the resultant varnish is impregnated into glass cloth (#7628 E-glass available from Nitto Boseki Co., Ltd.) to form a resin-impregnated sheet. The sheet is dried at 100 to 170° C. for 3 to 6 minutes to produce a prepreg. The resin content is adjusted to be about 40% by mass by adjusting the amount of the polyphenylene ether compound such as the modified polyphenylene ether compound, and the cross-linking hardener, which form the resin by a hardening reaction.

Four sheets of the prepreg thus obtained are laminated and subjected to a temperature of 200° C. and a pressure of 3 MPa for two hours, thereby forming an evaluation board with a thickness of about 0.8 mm. The prepreg and the evaluation board thus formed are evaluated as follows.

Dielectric Properties (Dielectric Constant and Dielectric Loss Tangent)

The dielectric constant and dielectric loss tangent of each evaluation board in 1 GHz are measured according to IPC-TM650-2.5.5.9. More specifically, the dielectric constant and dielectric loss tangent of each evaluation board in 1 GHz are measured using an impedance analyzer (RF impedance analyzer HP4291B available from Agilent Technologies).

Flame Retardance

Test pieces 125 mm in length and 12.5 mm in width are cut out of each evaluation board, and subjected to a flame test ten times according to Underwriters Laboratories "Test for Flammability of Plastic Materials-UL 94". More specifically, five test pieces are subjected to the flame test twice. Combustibility is evaluated from the total of the combustion duration in the flame test.

Glass Transition Temperature (Tg)

The Tg of each prepreg is measured using viscoelastic spectrometer DMS 100 available from Seiko Instruments Inc. In this case, the Tg is determined as a temperature at which tan δ is maximum when the temperature is raised from room temperature to 280° C. at a temperature rise rate of 5° C./min. after dynamic viscoelasticity is measured (DMA) with a bending modulus at a frequency of 10 Hz.

Hygroscopic-Solder Heat Resistance

Hygroscopic-solder heat resistance is measured according to JIS C 6481. More specifically, each evaluation board is subjected to a two-hour pressure cooker test (PCT) at 121° C. and 2 atm (0.2 MPa). Then, each evaluation board is soaked in a solder bath at 260° C. for 20 seconds to visually check the occurrence of measling or swelling. If such an occurrence is not observed in the five samples, the resistance is evaluated as OK; otherwise it is evaluated NG. The same evaluation is further performed using a solder bath at 288° C. instead of 260° C.

The evaluation results are shown in Tables 1 to 3.

TABLE 1

|  |  | Examples | | | | | | Comp. Examples | |
|---|---|---|---|---|---|---|---|---|---|
|  |  | X-1 | X-2 | X-3 | X-4 | X-5 | X-6 | X-1 | X-2 |
| PPE | modified PPE-1 | 50 | 50 | 50 | 50 | 50 | 50 | 50 | 50 |
| cross-linking hardener | TAIC | 50 | 50 | 50 | 50 | 50 | 50 | 50 | 50 |
| first phosphor compound | phosphate compound | 25 | 5 | 15 | 5 | 20 | 5 | 35 | — |
| second phosphor compound | phosphinate compound | 5 | 25 | 3 | 30 | 5 | 20 | — | 20 |

TABLE 1-continued

|  |  | Examples | | | | | | Comp. Examples | |
|---|---|---|---|---|---|---|---|---|---|
|  |  | X-1 | X-2 | X-3 | X-4 | X-5 | X-6 | X-1 | X-2 |
| reaction initiator | Perbutyl P | 2 | 2 | 2 | 2 | 2 | 2 | 2 | 2 |
| mass ratio of first and second phosphor compounds | | 83:17 | 17:83 | 83:17 | 14:86 | 80:20 | 20:80 | 100:0 | 0:100 |
| content of P atoms (% by mass) | | 2.6 | 4.8 | 1.7 | 5.4 | 2.4 | 4.0 | 2.3 | 3.8 |
| dielectric constant | | 3.8 | 3.9 | 3.7 | 4 | 3.8 | 3.8 | 3.8 | 3.9 |
| dielectric properties | | 0.002 | 0.002 | 0.001 | 0.003 | 0.002 | 0.002 | 0.002 | 0.002 |
| flame retardance (second) | | 35 | 26 | 52 | 19 | 35 | 30 | 115 | 95 |
| glass transition temperature (° C.) | | 190 | 230 | 210 | 230 | 200 | 230 | 170 | 240 |
| heat resistance | 260° C. | OK | OK | OK | OK | OK | OK | OK | OK |
|  | 288° C. | OK | NG | OK | NG | OK | OK | OK | OK |

TABLE 2

|  |  | Examples | | | | | | | Comp. Examples | |
|---|---|---|---|---|---|---|---|---|---|---|
|  |  | X-7 | X-8 | X-9 | X-10 | X-11 | X-12 | X-13 | X-3 | X-4 |
| PPE | modified PPE-1 | 50 | 50 | 50 | 50 | — | — | — | — | — |
|  | modified PPE-2 | — | — | — | — | 50 | — | — | — | — |
|  | modified PPE-3 | — | — | — | — | — | 50 | — | — | — |
|  | modified PPE-4 | — | — | — | — | — | — | 50 | — | — |
|  | unmodified PPE-1 | — | — | — | — | — | — | — | 50 | — |
|  | unmodified PPE-2 | — | — | — | — | — | — | — | — | 50 |
| cross-linking hardener | TAIC | — | — | — | — | 50 | 50 | 50 | 50 | 50 |
|  | styrene | 50 | — | — | — | — | — | — | — | — |
|  | DCP | — | 50 | — | — | — | — | — | — | — |
|  | DVB | — | — | 50 | — | — | — | — | — | — |
|  | polybutadiene oligomer | — | — | — | 50 | — | — | — | — | — |
| first phosphor compound | phosphate compound | 10 | 10 | 10 | 10 | 10 | 10 | 10 | 20 | 20 |
| second phosphor compound | phosphinate compound | 10 | 10 | 10 | 10 | 10 | 10 | 10 | 5 | 5 |
| reaction initiator | Perbutyl P | 2 | 2 | 2 | 2 | 2 | 2 | 2 | 2 | 2 |
| mass ratio of first and second phosphor compounds | | 50:50 | 50:50 | 50:50 | 50:50 | 50:50 | 50:50 | 50:50 | 80:20 | 80:20 |
| content of phosphorus atoms (% by mass) | | 2.7 | 2.7 | 2.7 | 2.7 | 2.7 | 2.7 | 2.7 | 2.4 | 2.4 |
| dielectric constant | | 3.7 | 3.7 | 3.7 | 3.7 | 3.8 | 3.8 | 3.8 | 3.8 | 3.8 |
| dielectric properties | | 0.001 | 0.001 | 0.001 | 0.001 | 0.002 | 0.002 | 0.002 | 0.004 | 0.004 |
| flame retardance (second) | | 35 | 36 | 35 | 39 | 35 | 35 | 35 | 145 | 138 |
| glass transition temp. (° C.) | | 210 | 220 | 220 | 220 | 210 | 200 | 225 | 130 | 150 |
| heat resistance | 260° C. | OK | OK | OK | OK | OK | OK | OK | NG | NG |
|  | 288° C. | OK | OK | OK | OK | OK | OK | OK | NG | NG |

TABLE 3

|  |  | Examples | | | |
|---|---|---|---|---|---|
|  |  | X-14 | X-15 | X-16 | X-17 |
| PPE | modified PPE-1 | 80 | 50 | 50 | 50 |
| cross-linking hardener | TAIC | 20 | 50 | 50 | 50 |
| first phosphor compound | phosphate compound | 20 | — | 20 | — |
|  | phosphazene compound | 5 | 5 | — | — |
| second phosphor compound | phosphinate compound | 5 | 5 | — | — |
|  | polyphosphate compound | — | — | 7 | 5 |
| reaction initiator | Perbutyl P | 2 | 2 | 2 | 2 |
| mass ratio of first and second phosphor compounds | | 80:20 | 80:20 | 80:20 | 80:20 |
| content of phosphorus atoms (% by mass) | | 2.4 | 3.0 | 2.1 | 2.6 |
| dielectric constant | | 3.6 | 3.7 | 3.7 | 3.8 |
| dielectric properties | | 0.001 | 0.002 | 0.002 | 0.002 |
| flame retardance (second) | | 42 | 33 | 47 | 43 |
| glass transition temperature (° C.) | | 200 | 205 | 200 | 205 |
| heat resistance | 260° C. | OK | OK | OK | OK |
|  | 288° C. | OK | OK | OK | OK |

As for Examples X-1 to X-17, used are TRCs containing a modified polyphenylene ether compound and a crosslinking hardener, and also containing both the first and second phosphor compounds as a flame retardant. As for Comparative Examples X-1 and X-2, on the other hand, TRCs containing only one of the first and second phosphor compounds as a flame retardant are used. As known from Tables 1 to 3, the laminates in Examples X-1 to X-17 are more excellent in flame retardance than those in Comparative Examples X-1 and X-2.

As for Examples X-1 to X-17, used are modified polyphenylene ether compounds as the polyphenylene ether compound, which are terminal-modified by substituents with carbon-carbon unsaturated double bonds. As for Comparative Examples X-3 and X-4, on the other hand, unmodified polyphenylene ether compounds are used. As known from Tables 1 to 3, the laminates in Examples X-1 to X-17 are more excellent in heat resistance and flame retardance than those in Comparative Examples X-3 and X-4.

When only one of the first and second phosphor compounds is contained as the flame retardant, if the flame retardant content is increased to improve the flame retardance, dielectric properties of the TRCs and the heat resistance of the hardened material are deteriorated. These results indicate that the concurrent use of the first and second phosphor compounds as the flame retardant allows TRCs that contain a modified polyphenylene ether compound and a cross-linking hardener to have excellent dielectric properties and also to provide the hardened material with excellent heat resistance and flame retardance.

groups is too small, the reactivity with the epoxy groups in the epoxy resin is low, tending to make the hardened material have insufficient heat resistance. When, on the other hand, the number is too large, the reactivity with the epoxy groups in the epoxy resin is too high. This tends to deteriorate the storage stability of the TRC or to cause problems such as increases in dielectric constant and in dielectric loss tangent of the TRC.

The number of hydroxyl groups in the polyphenylene ether compound can be found from the product specification value of the compound to be used. One example of the number is the average number of hydroxyl groups per molecule of the polyphenylene ether compound present in its one mole.

Thus, the polyphenylene ether compound used in the present exemplary embodiment, which has a comparatively low molecular weight and comparatively many terminal hydroxyl groups, is probably very likely to be three dimensionally cross-linked with the epoxy resin. Therefore, the use of this compound provides not only excellent dielectric properties in a wide frequency domain, but also sufficient fluidity to reduce molding defects, and increases the heat resistance of the hardened material.

The polyphenylene ether compound used in the present exemplary embodiment can be, for example, a polyphenylene ether synthesized from 2,6-dimethylphenol and at least one of bi- and tri-functional phenols, or can be mainly composed of poly(2,6-dimethyl-1,4-phenylene oxide). More specifically, it is preferably a compound having the structure expressed by Formula (8).

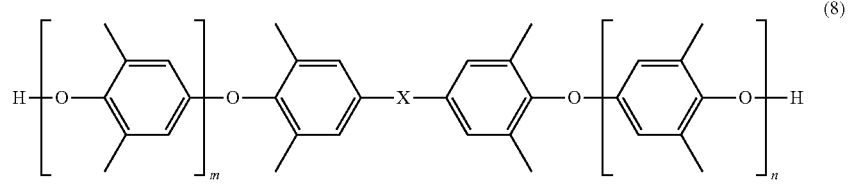

(8)

Second Exemplary Embodiment

The TRC according to the present exemplary embodiment contains a polyphenylene ether compound and an epoxy compound as the thermosetting resin, and a cyanate ester compound as the hardener.

The polyphenylene ether compound can be anything that has a weight-average molecular weight (Mw) of 500 to 5000, inclusive. In other words, the polyphenylene ether compound has Mw of 500 to 5000, inclusive, and more preferably, 500 to 3000, inclusive. When the molecular weight is too small, the heat resistance of the hardened material tends to be insufficient. When the molecular weight is too large, the TRC tends to have high melt viscosity, and hence, insufficient fluidity, making it impossible to prevent molding defects sufficiently. Therefore, the hardened material can have excellent heat resistance and moldability when the Mw of the polyphenylene ether compound is in the above-described range.

Note that the Mw can be measured, for example, by gel permeation chromatography.

In the polyphenylene ether compound used in the present exemplary embodiment, the average number of phenolic hydroxyl groups at the terminals (the number of terminal hydroxyl groups) per molecule is preferably 1 to 5, and more preferably 1.5 to 3. When the number of terminal hydroxyl In Formula (8), X is an alkylene group having 1 to 3 carbon atoms or a direct bond; m is between 0 to 20, inclusive; n is between 0 to 20, inclusive; and a total of m and n is between 1 and 30, inclusive. One example of the alkylene group is a dimethylmethylene group. In other words, the compound expressed in Formula (8) is identical to that in Formula (7).

The polyphenylene ether compound used in the present exemplary embodiment may contain a reaction product in which at least a part of the hydroxyl groups in the polyphenylene ether is pre-reacted with an epoxy compound. When the polyphenylene ether compound contains such a reaction product, the TRC according to the present exemplary embodiment contains the following: a polyphenylene ether having a Mw of 500 to 5000, and an epoxy compound; the reaction product obtained by pre-reacting at least a part of the hydroxyl groups in the polyphenylene ether with the epoxy groups of the epoxy compound; a cyanate ester compound; and a flame retardant. In this TRC, the flame retardant contains a first phosphor compound compatible with a mixture of the reaction product and the cyanate ester compound, and a second phosphor compound incompatible with the mixture. The epoxy compound used to obtain the reaction product is not limited as long as the TRC can be formed by reacting at least a part of the hydroxyl groups in the polyphenylene ether with the epoxy groups. One specific example is an epoxy compound in which the average number of epoxy groups per molecule (the average number of epoxy groups) in an epoxy compound, which will be described later, is 2 to 2.3

The above-mentioned reaction product can be anything that can be obtained by pre-reacting at least a part of the hydroxyl groups in the polyphenylene ether with the epoxy groups of the epoxy compound. One example is a reaction product in which at least a half of all hydroxyl groups in the polyphenylene ether before being reacted with the epoxy groups of the epoxy compound is reacted with them.

More specifically, one such reaction product can be obtained by the following reaction. First, a polyphenylene ether and an epoxy compound in a predetermined ratio are stirred in an organic solvent for 10 to 60 minutes. The predetermined ratio of the polyphenylene ether to the epoxy compound preferably satisfies the equivalent ratio of the hydroxyl groups in the polyphenylene ether to the epoxy groups in the epoxy compound so as to obtain the above-mentioned reaction product.

The polyphenylene ether and the epoxy compound are mixed together and heated at a temperature from 80° C. to 110° C. for 2 to 12 hours so as to react them with each other, thereby preparing a reaction product. The organic solvent may be anything that can dissolve the polyphenylene ether and the epoxy compound and that does not inhibit their reaction. One specific example is toluene.

It is possible to add a catalyst to the mixture of the polyphenylene ether and the epoxy compound during their reaction. The catalyst may be anything that can promote the reaction between the hydroxyl groups in the polyphenylene ether and the epoxy groups in the epoxy compound. Specific examples of the catalyst include the following: organometallic salts of an organic acid and a metal. Examples of the organic acid include an octanoic acid, a stearic acid, an acetylacetonate, a naphthenic acid, and a salicylic acid, and examples of the metal include Zn, Cu, or Fe; tertiary amines such as 1,8-diazabicyclo[5.4.0]undecene-7 (DBU), triethylamine, and triethanolamine; imidazoles such as 2-ethyl-4-imidazole (2E4MZ) and 4-methylimidazole; and organic phosphines such as triphenylphosphine (TPP), tributylphosphine, and tetraphenylphosphonium tetraphenylborate. These materials may be used alone or in combination of two or more. Among them, imidazoles, particularly 2-ethyl-4-imidazole, are preferable because they can reduce the reaction time and suppress the polymerization between the molecules of the epoxy compound (self-polymerization of the molecules of the epoxy compound).

The content of the catalyst is preferably in a range from 0.05 to 1 part by mass, inclusive, with respect to 100 parts by mass of the total of the polyphenylene ether and the epoxy compound. When the catalyst content is too low, it tends to take longer time for the reaction between the hydroxyl groups in the polyphenylene ether and the epoxy groups in the epoxy compound. When, on the other hand, the catalyst content is too high, it tends to become difficult to control the reaction, making the mixture gelate easily.

The epoxy compound used in the present exemplary embodiment may be anything that has two or more epoxy groups per molecule. In other words, the average number of epoxy groups per molecule (the average number of epoxy groups) in the epoxy compound is at least two, preferably 2 to 7, and more preferably 2 to 6. When the average number is within the above-mentioned range, the hardened material of the TRC has excellent heat resistance. The average number can be found from the product specification value of the epoxy compound to be used. One example of the average number of epoxy groups is the average number of epoxy groups per molecule of the epoxy compound present in its one mole.

The epoxy compound can be anything that is used as a material of various kinds of substrates for laminates and circuit boards. Specific examples of the epoxy compound include the following: bisphenol ones such as bisphenol A ones; dicyclopentadiene ones; cresol novolak ones; bisphenol A novolak ones; biphenyl aralkyl ones; and naphthalene ring-containing ones. Other examples of the epoxy compound are epoxy resins, which are polymers of the above-listed epoxy compounds.

The cyanate ester compound used in the present exemplary embodiment preferably has an average number of cyanate groups per molecule (the average number of cyanate groups) of two or more. It is preferable to have many cyanate groups because they can improve the heat resistance of the hardened material of the TRC. The average number of cyanate groups in the cyanate ester compound can be found from the product specification value of the cyanate resin to be used. One example of the number of the cyanate groups in the cyanate ester compound is the average number of the cyanate groups per molecule of the cyanate resin present in its one mole.

The cyanate ester compound can be anything that is used as a material of various kinds of substrates for laminates and circuit boards. Specific examples of the cyanate ester include the following: 2,2-bis(4-cyanatephenyl)propane, which is a bisphenol A cyanate compound; novolak and bisphenol M cyanate ester compounds; bis(3,5-dimethyl-4-cyanatephenyl)methane; and 2,2-bis(4-cyanatephenyl)ethane. Other examples of the cyanate ester compound are cyanate ester resins, which are polymers of the above-mentioned cyanate esters. These materials may be used alone or in combination of two or more.

The content of the polyphenylene ether compound is preferably in a range from 20 to 50 parts by mass, inclusive, with respect to 100 parts by mass of the total of the polyphenylene ether compound, the epoxy compound, and the cyanate ester compound. More preferably, the content is in a range from 25 to 45 parts by mass, inclusive. The content of the epoxy compound is preferably in a range from 20 to 50 parts by mass, inclusive, with respect to 100 parts by mass of the above total, and more preferably in a range from 25 to 50 parts by mass, inclusive. The content of the cyanate ester compound is preferably in a range from 20 to 50 parts by mass, inclusive, with respect to 100 parts by mass of the above total, and more preferably in a range from 20 to 40 parts by mass, inclusive. When the contents of these three compounds are within the above-mentioned respective ranges, the TRC can be turned into a hardened material excellent in heat resistance and flame retardance. This is probably because the hardening reaction between the three compounds proceeds smoothly.

The TRC according to the present exemplary embodiment preferably contains a metal soap as a curing catalyst. This TRC can be turned into a hardened material with excellent heat resistance and flame retardance, while maintaining the excellent dielectric properties of the polyphenylene ether.

The flame retardant used in the present exemplary embodiment contains a first phosphor compound compatible with a mixture of the polyphenylene ether compound, the epoxy compound, and the cyanate ester compound, and a second phosphor compound incompatible with the mixture. Specific examples of the first and second phosphor compounds are described above.

The TRC according to the present exemplary embodiment may further contain other components, such as a filler or an additive, of which specific examples are mentioned above.

The TRC according to the present exemplary embodiment contains a polyphenylene ether having excellent dielectric properties, so that the hardened material has also excellent dielectric properties. In addition, the TRC that contains the first and second phosphor compounds as a flame retardant has higher flame retardance than a case in which conventional phosphor compounds are used. Consequently, the TRC according to the present exemplary embodiment can be turned into a hardened material excellent in heat resistance and flame retardance while maintaining the excellent dielectric properties of the polyphenylene ether.

The advantageous effects of the present exemplary embodiment will be described in greater detail below as Examples. Note that the present invention is not limited to these Examples.

Examples Y-1 to Y-21 and Comparative Examples Y-1 to Y-5

The following is a description of each component used to form the TRC in the Examples.

Polyphenylene Ether Compound: PPE

As a polyphenylene ether compound, PPE-1 to PPE-4 described below are used.

PPE-1 is SA90 available from SABIC Innovative Plastics. SA90 has an intrinsic viscosity (IV) of 0.083 dl/g, two terminal hydroxyl groups, and a weight-average molecular weight (Mw) of 1700.

PPE-2 is SA120 available from SABIC Innovative Plastics, which has an IV of 0.125 dl/g, one terminal hydroxyl group, and a Mw of 2600.

PPE-3 is prepared by dividing and rearranging molecules of a polyphenylene ether. Noryl 640-111, which is available from SABIC Innovative Plastics, is used as the raw material. Noryl 640-111 has an IV of 0.45 dl/g, one terminal hydroxyl group, and a Mw of 47000. The division and rearrangement are performed specifically as follows.

200 g of Noryl 640-111, 65 g of bisphenol A as a phenol species, 65 g of benzoyl peroxide (Nyper BW available from NOF Corporation) as an initiator are weighed, and then 400 g of toluene is added as a solvent. These are mixed for one hour at 90° C. This results in a polyphenylene ether whose molecules are divided and rearranged and which has five terminal hydroxyl groups and a Mw of 2000.

PPE-4 is Noryl 640-111 available from SABIC Innovative Plastics.

Epoxy Compound

As the epoxy compound, five different epoxy resins shown below are used.

The first one is a bisphenol A epoxy resin, which is Epiclon 850S available from DIC Corporation and has an average number of epoxy groups of 2.

The second one is a cresol novolak epoxy resin, which is Epiclon N680 available from DIC Corporation and has an average number of epoxy groups of 6.

The third one is a dicyclopentadiene epoxy resin, which is Epiclon HP7200 available from DIC Corporation and has an average number of epoxy groups of 2.3.

The fourth one is a bisphenol A novolak epoxy resin, which is Epiclon N865 available from DIC Corporation and has an average number of epoxy groups of 5.6.

The fifth one is a naphthalene ring-containing epoxy resin, which is Epiclon HP4700 available from DIC Corporation and an average number of epoxy groups of 4.

Cyanate Ester Compound

As the cyanate ester compound, three different resins shown below are used.

The first one is a bisphenol A cyanate ester resin, which is Badcy available from Lonza Japan Ltd.

The second one is a novolak cyanate ester resin, which is PT-30 available from Lonza Japan Ltd.

The third one is a bisphenol M cyanate ester resin, which is XU-366 available from Huntsman Japan Co., Ltd.

First and Second Phosphor Compounds

As the first phosphor compound, the phosphate compound and the phosphazene compound described in Examples of the first exemplary embodiment are used. As the second phosphor compound, the phosphinate compound and the polyphosphate compound described in Examples of the first exemplary embodiment are used.

Metal Soap

As the metal soap, zinc octanoate available from DIC Corporation is used.

[Production Process]

The components are added to the toluene in ratios shown in Tables 4 to 6 so as to have 60% by mass of solid component concentration, and then mixed together. The mixture is stirred for 60 minutes to form a varnish-like TRC (a varnish).

Then, evaluation boards with a thickness of about 0.8 mm are formed as described in the same manner as in Examples of the first exemplary embodiment.

The prepregs and evaluation boards thus formed are evaluated for their dielectric properties (dielectric constant and dielectric loss tangent), flame retardance, glass transition temperature (Tg), and hygroscopic-solder heat resistance in the same manner as in Examples of the first exemplary embodiment. The evaluation results are shown in Tables 4 to 6.

TABLE 4

| | | Examples | | | | | | Comparative Examples | | | |
|---|---|---|---|---|---|---|---|---|---|---|---|
| | | Y-1 | Y-2 | Y-3 | Y-4 | Y-5 | 6 | Y-1 | Y-2 | Y-3 | Y-4 |
| PPE | PPE-1 | 30 | 30 | 30 | 30 | 30 | 30 | 30 | 30 | 30 | 30 |
| epoxy compound | bisphenol A epoxy resin | 40 | 40 | 40 | 40 | 40 | 40 | 40 | 40 | 40 | 40 |
| cyanate ester compound | bisphenol A cyanate ester resin | 30 | 30 | 30 | 30 | 30 | 30 | 30 | 30 | 30 | 30 |
| first phosphor compound | phosphate compound | 25 | 5 | 15 | 5 | 20 | 5 | 35 | — | 50 | — |
| second phosphor compound | phosphinate compound | 5 | 25 | 3 | 30 | 5 | 20 | — | 20 | — | 35 |
| metal soap | zinc octanoate | 0.01 | 0.01 | 0.01 | 0.01 | 0.01 | 0.01 | 0.01 | 0.01 | 0.01 | 0.01 |

TABLE 4-continued

|  | Examples | | | | | | Comparative Examples | | | |
| --- | --- | --- | --- | --- | --- | --- | --- | --- | --- | --- |
|  | Y-1 | Y-2 | Y-3 | Y-4 | Y-5 | 6 | Y-1 | Y-2 | Y-3 | Y-4 |
| mass ratio of first and second phosphor compounds | 83:17 | 17:83 | 83:17 | 14:86 | 80:20 | 20:80 | 100:0 | 0:100 | 0:100 | 0:100 |
| content of phosphorus atoms (% by mass) | 2.6 | 4.8 | 1.7 | 5.4 | 2.4 | 4.0 | 2.3 | 3.8 | 3.0 | 5.4 |
| dielectric constant | 4.2 | 4.3 | 4.1 | 4.4 | 4.2 | 4.2 | 4.2 | 4.3 | 4.2 | 4.3 |
| dielectric properties | 0.005 | 0.005 | 0.004 | 0.006 | 0.005 | 0.005 | 0.005 | 0.006 | 0.005 | 0.006 |
| flame retardance (second) | 37 | 27 | 66 | 23 | 36 | 32 | 120 | 102 | 95 | 82 |
| glass transition temp. (° C.) | 155 | 195 | 175 | 195 | 165 | 195 | 135 | 205 | 105 | 205 |
| heat resistance  260° C. | OK | OK | OK | OK | OK | OK | OK | OK | NG | NG |
| 288° C. | OK | NG | OK | NG | OK | OK | OK | OK | NG | NG |

TABLE 5

|  |  | Examples | | | | | | | | Comp. Example |
| --- | --- | --- | --- | --- | --- | --- | --- | --- | --- | --- |
|  |  | Y-7 | Y-8 | Y-9 | Y-10 | Y-11 | Y-12 | Y-13 | Y-14 | Y-5 |
| PPE | PPE-1 | 30 | 30 | 30 | 30 | — | — | 30 | 30 | — |
|  | PPE-2 | — | — | — | — | 30 | — | — | — | — |
|  | PPE-3 | — | — | — | — | — | 30 | — | — | — |
|  | PPE-4 | — | — | — | — | — | — | — | — | 30 |
| epoxy compound | bisphenol A epoxy resin | — | — | — | — | 40 | 40 | 40 | 40 | 40 |
|  | cresol novolak epoxy resin | 40 | — | — | — | — | — | — | — | — |
|  | dicyclopentadiene epoxy resin | — | 40 | — | — | — | — | — | — | — |
|  | bisphenol A novolak epoxy resin | — | — | 40 | — | — | — | — | — | — |
|  | naphthalene ring-containing epoxy resin | — | — | — | 40 | — | — | — | — | — |
| cyanate ester compound | bisphenol A cyanate ester resin | 30 | 30 | 30 | 30 | 30 | 30 | — | — | 30 |
|  | novolak cyanate ester resin | — | — | — | — | — | — | 30 | — | — |
|  | bisphenol M cyanate ester resin | — | — | — | — | — | — | — | 30 | — |
| first phosphor compound | phosphate compound | 10 | 10 | 10 | 10 | 10 | 10 | 10 | 10 | 20 |
| second phosphor compound | phosphinate compound | 10 | 10 | 10 | 10 | 10 | 10 | 10 | 10 | 5 |
| metal soap | zinc octanoate | 0.01 | 0.01 | 0.01 | 0.01 | 0.01 | 0.01 | 0.01 | 0.01 | 0.01 |
| mass ratio of 1st and 2nd phosphor compounds | | 50:50 | 50:50 | 50:50 | 50:50 | 50:50 | 50:50 | 50:50 | 50:50 | 80:20 |
| content of phosphorus atoms (% by mass) | | 2.7 | 2.7 | 2.7 | 2.7 | 2.7 | 2.7 | 2.7 | 2.7 | 2.4 |
| dielectric constant | | 4.2 | 4.0 | 4.2 | 4.1 | 4.2 | 4.2 | 4.2 | 4.1 | 4.2 |
| dielectric properties | | 0.005 | 0.004 | 0.005 | 0.004 | 0.004 | 0.005 | 0.005 | 0.004 | 0.006 |
| flame retardance (second) | | 35 | 37 | 36 | 32 | 35 | 37 | 32 | 32 | 102 |
| glass transition temp. (° C.) | | 200 | 190 | 195 | 220 | 180 | 180 | 210 | 200 | 1450 |
| heat resistance  260° C. | | OK | OK | OK | OK | OK | OK | OK | OK | NG |
| 288° C. | | OK | OK | OK | OK | OK | OK | OK | OK | NG |

TABLE 6

|  |  | \multicolumn{7}{c}{Examples} |
| --- | --- | --- | --- | --- | --- | --- | --- | --- |
|  |  | Y-15 | Y-16 | Y-17 | Y-18 | Y-19 | Y-20 | Y-21 |
| PPE | PPE-1 | 30 | 30 | 30 | 50 | 20 | 20 | 40 |
| epoxy compound | bisphenol A epoxy resin | 40 | 40 | 40 | 20 | 50 | 30 | 40 |
| cyanate ester compound | bisphenol A cyanate ester resin | 30 | 30 | 30 | 30 | 30 | 50 | 20 |
| first phosphor compound | phosphate compound | — | 20 | — | 10 | 10 | 10 | 10 |
| compound | phosphazene compound | 20 | — | 20 | — | — | — | — |
| second phosphor compound | phosphinate compound | 5 | — | — | 10 | 10 | 10 | 10 |
| compound | polyphosphate compound | — | 5 | 5 | — | — | — | — |
| metal soap | zinc octanoate | 0.01 | 0.01 | 0.01 | 0.01 | 0.01 | 0.01 | 0.01 |
| mass ratio of 1st and 2nd phosphor compounds |  | 80:20 | 80:20 | 80:20 | 50:50 | 50:50 | 50:50 | 50:50 |
| content of phosphorus atoms (% by mass) |  | 3.0 | 2.0 | 2.6 | 2.7 | 2.7 | 2.7 | 2.7 |
| dielectric constant |  | 4.1 | 4.2 | 4.1 | 4.1 | 4.3 | 4.1 | 4.3 |
| dielectric properties |  | 0.004 | 0.005 | 0.004 | 0.004 | 0.006 | 0.004 | 0.006 |
| flame retardance (second) |  | 35 | 49 | 43 | 33 | 38 | 34 | 35 |
| glass transition temp. (° C.) |  | 175 | 165 | 175 | 185 | 185- | 210 | 170 |
| heat resistance | 260° C. | OK | OK | OK | OK | OK | OK | OK |
|  | 288° C. | OK | OK | OK | OK | OK | OK | OK |

Examples Y-1 to Y-21 employ TRCs containing a polyphenylene ether compound, an epoxy compound, and a cyanate ester compound, and also containing both the first and second phosphor compounds as a flame retardant. Comparative Examples Y-1 and Y-2, on the other hand, employ TRCs containing only one of the first and second phosphor compounds as a flame retardant. As known from Tables 4 to 6, the laminates in Examples Y-1 to Y-21 are more excellent in flame retardance than those in Comparative Examples Y-1 and Y-2.

Comparative Examples Y-3 and Y-4 contain only one of the first and second phosphor compounds as a flame retardant. The content of the flame retardant is increased to improve the flame retardance; nevertheless, the hardened materials have lower heat resistance.

Examples Y-1 to Y-21 employ polyphenylene ether compounds having a Mw of 500 to 5000, inclusive. Comparative Example Y-5, on the other hand, employs a polyphenylene ether compound having a Mw exceeding 5000. As known from Tables 4 to 6, the laminates in Examples Y-1 to Y-21 are more excellent in heat resistance and flame retardance than that in Comparative Example Y-5. These results indicate that a laminate excellent in heat resistance and flame retardance cannot be formed merely by using both the first and second phosphor compounds as a flame retardant unless the polyphenylene ether compound has a Mw of 500 to 5000.

As described above, the TRC can be formed using a polyphenylene ether compound, an epoxy compound, a cyanate ester compound, and also using both the first and second phosphor compounds as a flame retardant. The above-described results indicate that the use of this TRC results in the formation of a hardened material excellent not only in dielectric properties, but also in heat resistance and flame retardance.

Examples Y-22 and Y-23

In these Examples, the polyphenylene ether compound and the epoxy compound are pre-reacted with each other. In other words, the TRCs in these Examples contain a reaction product in which at least a part of the hydroxyl groups in the polyphenylene ether in the polyphenylene ether compound is pre-reacted with the epoxy groups in the epoxy compound.

[Preparation of the Reaction Product]

PPE-1, the above-mentioned bisphenol A epoxy resin, and the catalyst mentioned later are weighed in the ratios shown in Table 7. All components are added to toluene, and stirred for six hours at 100° C. Thus, PPE-1 is reacted with the bisphenol A epoxy resin to form a pre-reacted reaction product. The catalyst used here is 2-ethyl-4-imidazole (2E4MZ) available from Shikoku Chemicals Corporation.

[The Result of Pre-Reaction (The Ratio of Reaction)]

The following is a description of a method for measuring the ratio of reaction obtained by pre-reaction when the entire number of hydroxyl groups in the polyphenylene ether (PPE-1) before reacting with the epoxy resin (bisphenol A epoxy resin) is made 1. This is, the number of hydroxyl groups reduced by the reaction with the epoxy groups of the epoxy resin is measured when the entire number of hydroxyl groups in the polyphenylene ether before reacting with the epoxy resin is made 1. More specifically, the solution of polyphenylene ether is measured at a wavelength of 318 nm before and after the reaction with the epoxy resin, using an ultraviolet absorptiometer (UV mini-1240 available from Shimadzu Corporation). Then, the absorbance ratio of the solution of polyphenylene ether before and after the reaction is calculated when its absorbance before the reaction is made 1. The ratio thus obtained is used to calculate the number of hydroxyl groups reduced by the reaction with the epoxy groups of the epoxy resin when the entire number of hydroxyl groups in the polyphenylene ether before the reaction is made 1.

In Example Y-22, the ratio of reaction is almost 1. In other words, almost all hydroxyl groups in PPE-1 are reacted with the epoxy groups of the epoxy resin. In Example Y-23, the ration of reaction is almost 1/2. In other words, almost half of the hydroxyl groups in PPE-1 are reacted with the epoxy groups of the epoxy resin.

[Preparation of TRCs]

TRCs are prepared in the same manner as in Examples Y-1 to Y-21 except for using the above-mentioned reaction product instead of the polyphenylene ether and the epoxy compound used in Examples Y-1 to Y-21, and also using the ratios shown in Table 7. The evaluation results in the same manner as Examples Y-1 to Y-21 are shown in Table 7.

TABLE 7

|  |  |  | Examples | |
|---|---|---|---|---|
|  |  |  | Y-22 | Y-23 |
| composition of a pre-reacted reaction product | PPE | PPE-1 | 30 | 30 |
|  | epoxy compound | bisphenol A epoxy resin | 40 | 40 |
|  | catalyst | 2E4MZ | 0.07 | 0.07 |
| the amount of reaction by pre-reaction |  |  | 1 | ½ |
| composition of materials other than the reaction product | cyanate ester compound | bisphenol A cyanate ester resin | 30 | 30 |
|  | first phosphor compound | phosphate compound | 10 | 10 |
|  | second phosphor compound | phosphinate compound | 10 | 10 |
|  | metal soap | zinc octanoate | 0.01 | 0.01 |
| mass ratio of first and second phosphor compounds |  |  | 50:50 | 50:50 |
| content of phosphorus atoms (% by mass) |  |  | 2.7 | 2.7 |
| evaluation | dielectric constant |  | 4.2 | 4.2 |
|  | dielectric properties |  | 0.005 | 0.005 |
|  | flame retardance (second) |  | 36 | 36 |
|  | glass transition temp. (° C.) |  | 195 | 195 |
|  | heat resistance | 260° C. | OK | OK |
|  |  | 288° C. | OK | OK |

As known from Table 7, laminates excellent in dielectric properties, heat resistance, and flame retardance can be formed as long as the TRC contains a polyphenylene ether compound, an epoxy compound, and a cyanate ester compound and also contains both the first and second phosphor compounds as a flame retardant even when the polyphenylene ether compound and the epoxy compound are pre-reacted.

Third Exemplary Embodiment

The TRC according to the present exemplary embodiment contains an epoxy compound as a thermosetting resin, and further contains as a hardener, at least one selected from the group consisting of phenolic ones, diamine-based ones, anhydride ones, cyanate-based ones, and isocyanate-based ones.

The epoxy compound can be anything that is used as a material of various kinds of substrates for laminates and circuit boards. Specific examples of the epoxy compound include the following: bisphenol ones such as bisphenol A ones; phenol novolak ones; dicyclopentadiene ones; cresol novolak ones; bisphenol A novolak ones; and naphthalene ring-containing ones. Other examples of the epoxy compound are epoxy resins, which are polymers of the epoxy compounds. Preferable among them are bisphenol epoxy resins such as bisphenol A ones, and phenol novolak ones. It is preferable that the epoxy compound has an epoxy equivalent of 100 to 500. Examples of the epoxy compound may be used alone or in combination of two or more. In short, it is preferable to use at least one selected from the group consisting of the above-listed epoxy compounds.

Examples of the hardener used in the present exemplary embodiment include the following: phenolic ones, diamine-based ones, anhydride ones, cyanate-based ones, and isocyanate-based ones. It is preferable to use at least one selected from the group consisting of these hardeners.

Examples of the phenolic hardener include the following: phenol novolak resins, phenol aralkyl resins, bisphenol A novolak resins, cresol novolak resins, and naphthol aralkyl resins. Examples of the diamine-based hardener include diethyldiaminodiphenylmethane and dicyandiamide. Examples of the anhydride hardener include methylhexahydrophthalic anhydride (MHHPA) and methyltetrahydrophthalic anhydride. Examples of the cyanate-based hardener include bisphenol A cyanate ester resins. Examples of the isocyanate-based hardener include 4,4'-diphenylmethane diisocyanate (MDI), 2,4-toluene diisocyanate (2,4-TDD, and 2,6-toluene diisocyanate (2,6-TDI).

The equivalent ratio of the hardener with respect to the epoxy compound is preferably in a range from 0.3 to 2, inclusive, and more preferably in a range from 0.5 to 1.5, inclusive. Thus, it is preferable that the contents of the epoxy compound and the hardener satisfy the above equivalent ratio. A TRC in which the contents of the epoxy compound and the hardener satisfy the above equivalent ratio can be turned into a hardened material with excellent heat resistance and flame retardance. This is considered to be due to the smooth progress of the hardening reaction between the epoxy compound and the hardener.

The flame retardant used in the present exemplary embodiment contains a first phosphor compound compatible with a mixture of the epoxy compound and the hardener, and a second phosphor compound incompatible with the mixture. Specific examples of the first and second phosphor compounds are mentioned above.

The TRC according to the present exemplary embodiment may further contain a catalyst (hardening accelerator) for promoting the reaction between the epoxy compound and the hardener. Specific examples of the catalyst are mentioned in the second exemplary embodiment.

The TRC according to the present exemplary embodiment may further contain other components, such as a filler or an additive, of which specific examples are mentioned above.

The advantageous effects of the present exemplary embodiment will be described in greater detail below as Examples. Note that the present invention is not limited to these Examples.

Examples Z-1 to Z-15 and Comparative Examples Z-1 to Z-4

The following is a description of each component used to form the TRC in these Examples.

Epoxy Compound

As an epoxy compound, the following two types are used.

One is Epiclon 850S available from DIC Corporation, which is a bisphenol A epoxy resin and has an epoxy equivalent of 188.

The other is Epiclon N775 available from DIC Corporation, which is a phenol novolak epoxy resin and has an epoxy equivalent of 190.

Hardener

Examples of the hardener include the following: phenolic, diamine-based, anhydride, cyanate-based, and isocyanate-based hardeners, which are described as follows.

The phenolic hardener is TD-2090 available from DIC Corporation, which is a novolak phenol resin having a functional group equivalent of 105.

The diamine-based hardener is aromatic diamine, Kayahard AA available from Nippon Kayaku Co., Ltd., which is 3,3'-diethyl-4,4'-diaminodiphenylmethane (4,4'-diamino-3,3'-diethyldiphenylmethane) having a functional group equivalent of 63.

The anhydride hardener is B-650 available from DIC Corporation, which is methylhexahydrophthalic anhydride (MHHPA) having a functional group equivalent of 168.

The cyanate-based hardener is Badcy available from Lonza Japan Ltd., which is a bisphenol A cyanate ester resin having a functional group equivalent of 139.

The isocyanate-based hardener is a product available from Nacalai Tesque, INC., which is 4,4'-diphenylmethane diisocyanate (MDI) having a functional group equivalent of 125.

First and Second Phosphor Compounds

As the first phosphor compound, the phosphate compound and the phosphazene compound described in Examples of the first exemplary embodiment are used. As the second phosphor compound, the phosphinate compound and the polyphosphate compound described in Examples of the first exemplary embodiment are used.

Filler

The filler is spherical silica, which is SO 25R available from Admatechs Co., Ltd.

[Production Process]

All components are added to MEK in ratios shown in Tables 8 and 9 so as to have 60% by mass of solid component concentration, and then mixed together. The mixture is heated to 80° C. and then stirred for 30 minutes while being kept at 80° C., thereby forming a varnish-like TRC (a varnish).

Then, evaluation boards with a thickness of about 0.8 mm are formed as described in the same manner as in Examples of the first exemplary embodiment. Note that the amount of impregnated resin is adjusted so that the resin content of the prepreg can be about 50% by mass, and that the drying conditions to form the prepreg are six minutes and 150° C.

The prepregs and evaluation boards thus formed are evaluated for their flame retardance, glass transition temperature (Tg), and hygroscopic-solder heat resistance in the same manner as in Examples of the first exemplary embodiment. The evaluation results are shown in Tables 8 and 9.

TABLE 8

| | | Examples | | | | | | Comparative Examples | | | |
|---|---|---|---|---|---|---|---|---|---|---|---|
| | | Z-1 | Z-2 | Z-3 | Z-4 | Z-5 | Z-6 | Z-1 | Z-2 | Z-3 | Z-4 |
| thermosetting compound | bisphenol A epoxy resin | 65 | 65 | 65 | 65 | 65 | 65 | 65 | 65 | 65 | 65 |
| hardener | phenolic hardener | 35 | 35 | 35 | 35 | 35 | 35 | 35 | 35 | 35 | 35 |
| first phosphor compound | phosphate compound | 25 | 5 | 15 | 5 | 20 | 5 | 35 | — | 50 | — |
| second phosphor compound | phosphinate compound | 5 | 25 | 3 | 30 | 5 | 20 | — | 20 | — | 35 |
| mass ratio of 1st and 2nd phosphor compounds | | 83:17 | 17:83 | 83:17 | 14:86 | 80:20 | 20:80 | 100:0 | 0:100 | 100:0 | 0:100 |
| content of phosphorus atoms (% by mass) | | 2.6 | 4.8 | 1.7 | 5.4 | 2.4 | 4.0 | 2.3 | 3.8 | 2.3 | 3.8 |
| flame retardance (second) | | 45 | 36 | 65 | 31 | 49 | 41 | 120 | 108 | 85 | 75 |
| glass transition temp. (° C.) | | 150 | 185 | 170 | 185 | 160 | 185 | 130 | 190 | 110 | 190 |
| heat resistance | 260° C. | OK | OK | OK | OK | OK | OK | OK | OK | NG | NG |
| | 288° C. | OK | NG | OK | NG | OK | OK | OK | OK | NG | NG |

TABLE 9

| | | Examples | | | | | | | | |
|---|---|---|---|---|---|---|---|---|---|---|
| | | Z-7 | Z-8 | Z-9 | Z-10 | Z-11 | Z-12 | Z-13 | Z-14 | Z-15 |
| thermosetting compound | bisphenol A epoxy resin | — | 70 | 60 | 60 | 60 | 65 | 65 | 65 | 65 |
| | phenol novolak epoxy resin | 65 | — | — | — | — | — | — | — | — |
| hardener | phenolic | 35 | — | — | — | — | 35 | 35 | 35 | 35 |
| | diamine-based | — | 30 | — | — | — | — | — | — | — |
| | anhydride | — | 0 | 40 | — | — | — | — | — | — |
| | cyanate-based | — | 0 | 0 | 40 | — | — | — | — | — |
| | isocyanate-based | — | 0 | 0 | 0 | 40 | — | — | — | — |
| first phosphor compound | phosphate compound | 10 | 10 | 10 | 10 | 10 | — | 20 | — | 20 |
| | phosphazene compound | — | — | — | — | — | 20 | — | 20 | — |
| second phosphor compound | phosphinate compound | 10 | 10 | 10 | 10 | 10 | 5 | — | — | 5 |
| | polyphosphate compound | — | — | — | — | — | — | 5 | 5 | — |
| filler | spherical silica | — | — | — | — | — | — | — | — | 80 |
| mass ratio of 1st and 2nd phosphor compounds | | 50:50 | 50:50 | 50:50 | 50:50 | 50:50 | 80:20 | 80:20 | 80:20 | 80:20 |
| content of P atoms (% by mass) | | 2.7 | 2.7 | 2.7 | 2.7 | 2.7 | 3.0 | 2.0 | 2.6 | 2.4 |
| flame retardance (second) | | 42 | 45 | 52 | 40 | 57 | 46 | 60 | 49 | 43 |
| glass transition temp. (° C.) | | 210 | 190 | 195 | 195 | 180 | 165 | 160 | 165 | 160 |

TABLE 9-continued

|  |  | Examples | | | | | | | | |
|---|---|---|---|---|---|---|---|---|---|---|
|  |  | Z-7 | Z-8 | Z-9 | Z-10 | Z-11 | Z-12 | Z-13 | Z-14 | Z-15 |
| heat resistance | 260° C. | OK | OK | OK | OK | OK | OK | OK | OK | OK |
|  | 288° C. | OK | OK | OK | OK | OK | OK | OK | OK | OK |

Examples Z-1 to Z-15 employ TRCs containing an epoxy compound and a hardener, and also containing both the first and second phosphor compounds as a flame retardant. Comparative Examples Z-1 to Z-4, on the other hand, employ TRCs containing only one of the first and second phosphor compounds as a flame retardant. As known from Tables 8 and 9, the laminates in Examples Z-1 to Z-15 are more excellent in flame retardance than those in Comparative Examples Z-1 to Z-4.

Comparative Examples Z-3 and Z-4 contain only one of the first and second phosphor compounds as a flame retardant. The content of the flame retardant is increased to improve the flame retardance; nevertheless, the hardened materials have low heat resistance.

As described above, the TRC containing an epoxy compound and a hardener can be formed using both the first and second phosphor compounds as a flame retardant. These results indicate that the use of this TRC results in the formation of a hardened material excellent not only in dielectric properties, but also in heat resistance and flame retardance.

INDUSTRIAL APPLICABILITY

The thermosetting resin composition according to the present invention is useful to produce a printed circuit board excellent in heat resistance and flame retardance.

The invention claimed is:

1. A thermosetting resin composition comprising:
   a thermosetting resin;
   a hardener capable of reacting with the thermosetting resin; and
   a flame retardant containing a first phosphor compound compatible with a mixture of the thermosetting resin and the hardener, and a second phosphor compound incompatible with the mixture,
   wherein the thermosetting resin contains a modified polyphenylene ether compound which has a structure in which a polyphenylene is terminal-modified by a substituent expressed by the following formula (4):

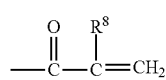

(4)

wherein $R^8$ in formula (4) is either a hydrogen atom or an alkyl group; and
   the hardener contains a cross-linking hardener having carbon-carbon unsaturated double bonds in a molecule.

2. The thermosetting resin composition according to claim 1,
   wherein a mass ratio of the first phosphor compound is 20% to 80%, inclusive, with respect to a total of the first and second phosphor compounds.

3. The thermosetting resin composition according to claim 1, wherein a content of phosphorus atoms is in a range from 1.8 to 5.2 parts, inclusive, by mass with respect to 100 parts by mass of a total of the flame retardant and organic components other than the flame retardant.

4. The thermosetting resin composition according to claim 1,
   wherein the first phosphor compound is at least one selected from the group consisting of phosphate compounds, phosphazene compounds, phosphite compounds, and phosphine compounds; and
   the second phosphor compound is at least one selected from the group consisting of phosphinate compounds, polyphosphate compounds, and phosphonium salt compounds.

5. The thermosetting resin composition according to claim 1, further comprising as a filler at least one selected from the group consisting of silicas, micas, and talcs.

6. The thermosetting resin composition according to claim 5, wherein a content of the filler is in a range from 10 to 300 parts by mass, inclusive, with respect to 100 parts by mass of a total of the flame retardant and organic components other than the flame retardant.

7. The thermosetting resin composition according to claim 1,
   wherein a weight-average molecular weight of the cross-linking hardener is 100 to 5000; and
   an average number of the carbon-carbon unsaturated double bonds per molecule of the cross-linking hardener is in a range from 1 to 20, inclusive.

8. The thermosetting resin composition according to claim 1,
   wherein the cross-linking hardener is at least one selected from the group consisting of trialkenyl isocyanurate compounds; polyfunctional acrylate compounds having at least two acrylic groups in a molecule; polyfunctional methacrylate compounds having at least two methacrylic groups in a molecule; and polyfunctional vinyl compounds having at least two vinyl groups in a molecule.

9. The thermosetting resin composition according to claim 1,
   wherein a weight-average molecular weight of the modified polyphenylene ether compound is 500 to 5000; and
   an average number of the substituents per molecule of the modified polyphenylene ether compound is in a range from 1 to 5, inclusive.

10. The thermosetting resin composition according to claim 1,
    wherein the substituents at a terminal of the modified polyphenylene ether compound have at least one selected from the group consisting of a vinylbenzyl group, an acrylate group, and a methacrylate group.

11. The thermosetting resin composition according to claim 1,
    wherein a mass ratio of the modified polyphenylene ether compound with respect to a total of the modified polyphenylene ether compound and the cross-linking hardener is in a range from 30% to 90%, inclusive.

12. A prepreg comprising:
a fibrous base member; and
the thermosetting resin composition according to claim 1, impregnated into the fibrous base member.

13. A metal-clad laminate comprising:
an insulating layer as a hardened material of the prepreg according to claim 12; and
a metal foil laminated on the insulating layer.

14. A printed circuit board comprising:
an insulating layer as a hardened material of the prepreg according to claim 12; and
a conductor pattern formed on the insulating layer.

15. A thermosetting resin composition comprising:
a thermosetting resin;
a hardener capable of reacting with the thermosetting resin; and
a flame retardant containing a first phosphor compound compatible with a mixture of the thermosetting resin and the hardener, and a second phosphor compound incompatible with the mixture,
wherein
the thermosetting resin contains a polyphenylene ether compound having a weight-average molecular weight of 500 to 5000 and an epoxy compound having at least two epoxy groups in a molecule,
the hardener contains a cyanate ester compound,
a mass ratio of the first phosphor compound is from 20% to 80%, inclusive, with respect to a total of the first and second phosphor compounds; and
a content of each of the polyphenylene ether compound, the epoxy compound, and the cyanate ester compound is in a range from 20 to 50 parts by mass, inclusive, with respect to 100 parts by mass of a total of the polyphenylene ether compound, the epoxy compound, and the cyanate ester compound.

16. The thermosetting resin composition according to claim 15, wherein
the polyphenylene ether compound contains one or more phenolic hydroxyl groups at a terminal; and
an average number of the phenolic hydroxyl group per molecule of the polyphenylene ether compound is in a range from 1 to 5, inclusive.

17. The thermosetting resin composition according to claim 15,
wherein the polyphenylene ether compound contains a reaction product in which at least a part of the hydroxyl groups in the polyphenylene ether are pre-reacted with the epoxy groups of the epoxy compound.

18. The thermosetting resin composition according to claim 15, further comprising a metal soap as a curing catalyst.

19. The thermosetting resin composition according to claim 15,
wherein the epoxy compound is at least one selected from the group consisting of bisphenol epoxy compounds, phenol novolak epoxy compounds, dicyclopentadiene epoxy compounds, cresol novolak epoxy compounds, bisphenol A novolak epoxy compounds, and naphthalene ring-containing epoxy compounds.

20. The thermosetting resin composition according to claim 15,
wherein a content of phosphorus atoms is in a range from 1.8 to 5.2 parts, inclusive, by mass with respect to 100 parts by mass of a total of the flame retardant and organic components other than the flame retardant.

21. The thermosetting resin composition according to claim 15,
wherein the first phosphor compound is at least one selected from the group consisting of phosphate compounds, phosphazene compounds, phosphite compounds, and phosphine compounds; and
the second phosphor compound is at least one selected from the group consisting of phosphinate compounds, polyphosphate compounds, and phosphonium salt compounds.

22. The thermosetting resin composition according to claim 15, further comprising as a filler at least one selected from the group consisting of silicas, micas, and talcs.

23. The thermosetting resin composition according to claim 22,
wherein a content of the filler is in a range from 10 to 300 parts by mass, inclusive, with respect to 100 parts by mass of a total of the flame retardant and organic components other than the flame retardant.

24. A prepreg comprising:
a fibrous base member; and
the thermosetting resin composition according to claim 15, impregnated into the fibrous base member.

25. A metal-clad laminate comprising:
an insulating layer as a hardened material of the prepreg according to claim 24; and
a metal foil laminated on the insulating layer.

26. A printed circuit board comprising:
an insulating layer as a hardened material of the prepreg according to claim 24; and
a conductor pattern formed on the insulating layer.

* * * * *